(12) United States Patent
Ezaki et al.

(10) Patent No.: US 7,342,822 B2
(45) Date of Patent: Mar. 11, 2008

(54) MAGNETIC MEMORY DEVICE, WRITE CURRENT DRIVER CIRCUIT AND WRITE CURRENT DRIVING METHOD

(75) Inventors: Joichiro Ezaki, Chuo-ku (JP); Yuji Kakinuma, Chuo-ku (JP); Keiji Koga, Chuo-ku (JP); Shigekazu Sumita, Chuo-ku (JP)

(73) Assignee: TDK Corporation, Tokyo (JP)

( * ) Notice: Subject to any disclaimer, the term of this patent is extended or adjusted under 35 U.S.C. 154(b) by 106 days.

(21) Appl. No.: 10/540,400

(22) PCT Filed: Jan. 15, 2004

(86) PCT No.: PCT/JP2004/000249

§ 371 (c)(1),
(2), (4) Date: Jun. 23, 2005

(87) PCT Pub. No.: WO2004/066308

PCT Pub. Date: Aug. 5, 2004

(65) Prior Publication Data

US 2006/0256461 A1    Nov. 16, 2006

(30) Foreign Application Priority Data

Jan. 17, 2003    (JP) .............................. 2003-009881

(51) Int. Cl.
*G11C 11/00*    (2006.01)
(52) U.S. Cl. .................... 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 5,343,422 A | 8/1994 | Kung et al. | |
| 5,629,922 A | 5/1997 | Moodera et al. | |
| 6,404,674 B1 | 6/2002 | Anthony et al. | |
| 6,574,138 B2 * | 6/2003 | Schwarzl et al. | 365/158 |
| 6,618,317 B1 * | 9/2003 | Tsuji et al. | 365/230.07 |
| 6,785,158 B2 * | 8/2004 | Nagashima | 365/157 |
| 6,847,544 B1 * | 1/2005 | Smith et al. | 365/158 |
| 6,847,568 B2 * | 1/2005 | Gogl et al. | 365/205 |
| 6,882,565 B2 * | 4/2005 | Tsuchida | 365/171 |
| 6,885,576 B2 * | 4/2005 | Deak | 365/158 |
| 6,958,928 B2 * | 10/2005 | Ooishi | 365/158 |

(Continued)

FOREIGN PATENT DOCUMENTS

JP    A 09-091949    4/1997

*Primary Examiner*—Connie C. Yoha
(74) *Attorney, Agent, or Firm*—Oliff & Berridge PLC

(57) ABSTRACT

The number of write circuit components, variations in a write current flowing through each write line, and the power consumption for write operation can be reduced. A first constant current circuit and a second constant current circuit (a transistor (Q8) and a resistor (R4), and a transistor (Q7) and a resistor (R3)) are shared among a plurality of current direction control portions (54$n$−1, 54$n$, 54$n$+1, ... ). The constant current circuits are connected to each current direction control portion (54) through a first circuit selector switch (SW1 ... , SW1$n$, SW1$n$+1, ... ) and a second circuit selector switch (SW2 ... , SW2$n$, SW2$n$+1, ... ) disposed for each current direction control portion (54). Moreover, a decode signal voltage is applied to the constant current circuits from a word decode line (16X) (bit decode line (16Y)) through the circuit selector switches (SW1) and (SW2).

21 Claims, 21 Drawing Sheets

U.S. PATENT DOCUMENTS 6,996,001 B2 * 2/2006 Ezaki et al. ................ 365/171
2002/0006058 A1 1/2002 Nakajima et al.
2002/0154540 A1 10/2002 Sekiguchi et al.
2002/0172068 A1 11/2002 Hidaka

* cited by examiner

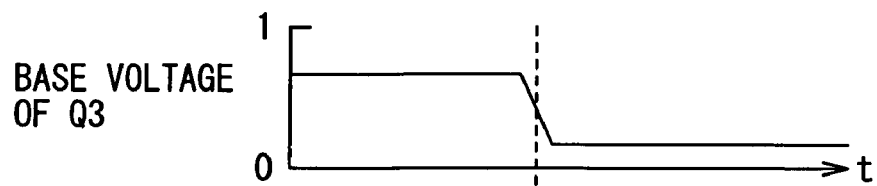
FIG. 14A  BASE VOLTAGE OF Q3
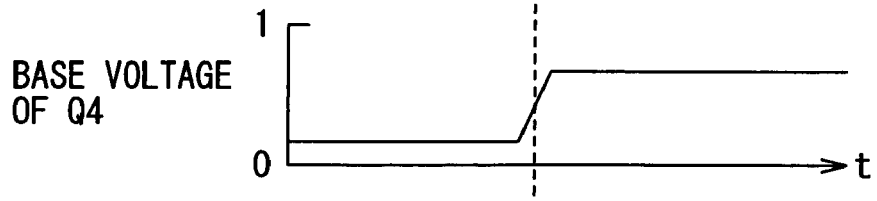
FIG. 14B  BASE VOLTAGE OF Q4
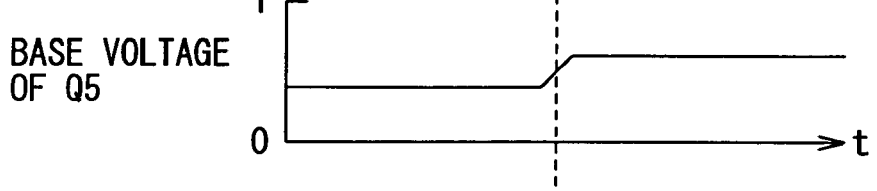
FIG. 14C  BASE VOLTAGE OF Q5
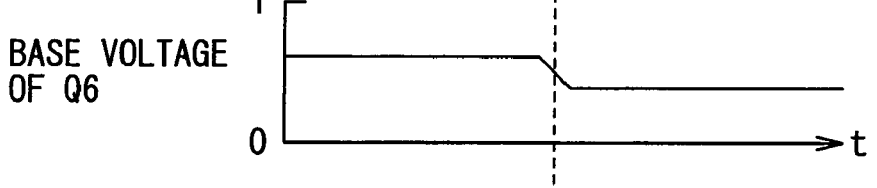
FIG. 14D  BASE VOLTAGE OF Q6
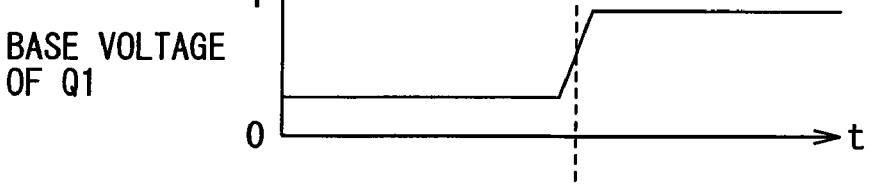
FIG. 14E  BASE VOLTAGE OF Q1
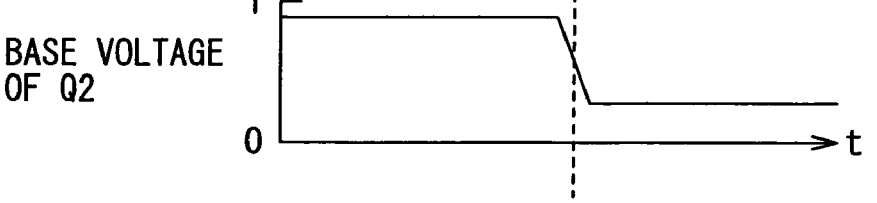
FIG. 14F  BASE VOLTAGE OF Q2

| TRANSISTOR 461 | TRANSISTOR 462 | SWITCH SW1 (SW2) |
|---|---|---|
| L | L | OFF |
| L | H | ON |
| H | L | OFF |
| H | H | OFF |

MAGNETIC MEMORY DEVICE, WRITE CURRENT DRIVER CIRCUIT AND WRITE CURRENT DRIVING METHOD

TECHNICAL FIELD

The present invention relates to a magnetic memory device which includes a magnetoresistive device including a ferromagnet, and writes and stores information through controlling the magnetization of the ferromagnet, a write current drive circuit and a write current driving method which are applied to a magnetic memory device.

BACKGROUND ART

Conventionally, as general-purpose memories used in information processors such as computers or mobile communications devices, volatile memories such as DRAMs (Dynamic Random Access Memories) or SRAMs (Static RAMs) are used. Unless a current is always supplied to the memories, the volatile memories lose all information. Therefore, it is necessary to separately provide non-volatile memories for storing information, and as the non-volatile memories, flash EEPROMs (Electrically Erasable and Programmable ROMs), hard disk drives and the like are used. As information processing becomes faster, speeding up of the non-volatile memories is an important issue. Moreover, from another standpoint of recent development of information devices intended for so-called ubiquitous computing, the development of high-speed non-volatile memories as key devices has been strongly desired.

As an effective technique for the speeding up of the non-volatile memories, a MRAM (Magnetic Random Access Memory) is known. In the MRAM, each of memory cells arranged in a matrix form includes a magnetic device. A currently practical MRAM uses a giant magneto-resistive effect (GMR). The GMR is a phenomenon that in a laminate in which two ferromagnetic layers having easy magnetization axes oriented in the same direction are stacked, the resistance of the laminate is minimum in the case where the magnetization direction of each ferromagnetic layer is parallel to the easy magnetization axes, and is maximum in the case where the magnetization direction of each ferromagnetic layer is antiparallel to the easy magnetization axes. Each memory cell stores information of either of the two states corresponding to binary information "0" or "1", and detects a difference in resistance corresponding to information as a change in current or voltage so as to read information. In an actual GMR device, two ferromagnetic layers are stacked with a non-magnetic layer in between, and the GMR device includes a fixed layer of which the magnetization direction is fixed, and a free layer (magnetic sensitive layer) of which the magnetization direction is changeable according to an external magnetic field.

Moreover, in a magnetic device using a tunneling magneto-resistive effect (TMR), the MR ratio can be much larger than that in the GMR device. The TMR is a phenomenon that in a laminate including two ferromagnetic layers (a fixed layer of which the magnetization direction is fixed and a magnetic sensitive layer of which the magnetization direction changeable, that is, a free layer) stacked with an insulating layer in between, the value of a tunnel current flowing through the insulating layer changes according to a relative angle between the magnetization directions of the two ferromagnetic layers. In other words, in the case where the magnetization directions are parallel to each other, the tunnel current is maximum (the resistance of the device is minimum), and in the case where the magnetization directions are antiparallel to each other, the tunnel current is minimum (the resistance of the device is maximum). As a specific example of the TMR device, a laminate structure of CoFe/Al oxide/CoFe is known, and its MR ratio is 40% or more. Moreover, the TMR device has high resistance, so it is considered that the TMR device easily matches a semiconductor device such as a MOS field effect transistor (MOSFET: Metal-Oxide-Semiconductor Field Effect Transistor). Such advantages allow a TMR-MRAM to achieve a higher output than the GMR-MRAM, so improvements in the memory capacity and the access speed of the TMR-MRAM are expected.

In both the GMR-MRAM and the TMR-MRAM, information is written in the same manner. More specifically, a current flows through a lead to induce a magnetic field, and the magnetization direction of the free layer is changed by the current magnetic field. Thereby, the relative magnetization directions of the ferromagnetic layers become parallel or antiparallel to each other, and corresponding binary information is stored.

For example, a TMR-MRAM in a related art has the following structure. As shown in FIG. 22, each write word line 202 (and each read word line 203) and each write/read bit line 201 are disposed so as to be orthogonal to each other. In this description, a line for writing is generically called write line. Moreover, a TMR device 207 is disposed between the write word line and the write/read bit line 201 in each intersection region to form each memory cell, although it is not shown. FIG. 23 shows a typical structure of the TMR device. Thus, the TMR device 207 includes a laminate which includes a first magnetic layer 204 as a fixed layer, a tunnel barrier layer 205 and a second magnetic layer 206 as a free layer. Moreover, the bit line 201 is disposed on one side of the laminate, and the read word line 203 and the write word line 202 are disposed on the opposite side of the laminate.

In the MRAM with such a structure, storing information in a memory cell means controlling the magnetization direction of the second magnetic layer 206 to a direction according to information. Information is stored in a target memory cell through flowing a current through a bit line 201 and a write word line 202 which are disposed so that the target memory cell is sandwiched therebetween. A magnetic field is induced by each current flowing through the write lines to generate a combined magnetic field, and the magnetization direction of the second magnetic layer 206 is changed by the combined magnetic field.

At this time, a write current is supplied to the write lines from a write current drive circuit (current drive). FIG. 24 shows an example of the structure of a current drive applied to a MRAM in a related art (refer to ISSCC 2000 Digest paper TA7.2). The circuit includes a portion for producing a pulse of which the shape is determined by a necessary write current value or the like and a portion for selecting a target write line to send the produced pulse to the selected write line. In this case, a reference signal generating portion 211, a positive amplifier 213A, a negative amplifier 213B, a current direction selecting portion 214, a timing block 216 and a pulse width controlling portion 217 correspond to the former portion. Further, a write line selecting portion 219 corresponds to the latter portion. The timing block 216 controls the timing of the pulse width controlling portion 217 as a time switch by a timing signal inputted into the write signal input line 215. The write line selecting portion 219 selects a write line where a pulse is supplied according to a decode signal inputted into an address decode line 218, and the write line selecting portion 219 typically includes a large number of switching devices each of which corresponds to each write line. An end of the write line is connected to the write line selecting portion 219, and the other end of the write line is grounded.

In the circuit, a data signal line 212 (Din) is branched, and at each branch of the data signal line 212, a positive amplification signal and a negative amplification signal are generated by the positive amplifier 213A and the negative amplifier 213B, and either of the positive amplification signal and the negative amplification signal is selected by the current direction selecting portion 214. Moreover, a reference signal is inputted into the positive amplifier 213A and the negative amplifier 213B from the reference signal generating portion 211 so as to adjust the magnitude of the inputted signal to a reference value. The data signal is a "High" or "Low" digital signal which represents data to be written, and in the circuit portion, for example, a "High" digital signal is simply amplified by the positive amplifier 213A, and a "Low" digital signal is inversely amplified to the pulse of a negative potential (that is, an amplified signal is selected), and as a result, either of a positive pulse and a negative pulse with a magnitude at a reference value is generated according to the data signal. The pulse is adjusted to a predetermined pulse width according to a necessary current amount in the pulse width controlling portion 217 to produce a write pulse. The write pulse is supplied to the write line according to the decode signal through the write line selecting portion 219. At this time, when a positive write pulse is applied to the write line, a current flows through the write line toward a ground side, and when a negative write pulse is applied, a current flows from the ground side to a pulse supply end.

Thus, conventionally, the shape and the sign of the pulse are adjusted so as to generate a write pulse which supplies a desired current amount to a predetermined direction of the write line, and the write pulse is supplied to the write line. FIG. 25A functionally shows such a current drive in a related art. A constant current control portion 300 represents a circuit element having a function of controlling the write current amount to a predetermined value in the above current drive including the reference signal generating portion 211 (in general, the height of a pulse cannot be controlled with high precision only by the reference signal generating portion 211, so a circuit for making a fine adjustment to a pulse voltage value is added).

However, in an actual MRAM, variations in the resistances of the write lines occur. The variations in resistance occur in the case where the lengths or the shapes of write lines vary depending upon the position of each write line or by a manufacturing error or the like. On the other hand, the current drive in the related art does not control the write current once supplied to the write line, so there is a problem that the amount of a current which actually flows varies from one write line to another according to the resistance. In other words, even if the current drive in the related art can control the write pulse with high precision, the current drive does not have a function of adjusting the supplied current amount according to the resistance of each write line, so an influence of resistance variations cannot be removed, and it is difficult to stably supply a constant current to the write lines.

In the MRAM, a magnetic field for write operation is a current magnetic field induced by a write current, so a write state (a magnetization state) in a device is determined by the magnitude of the magnetic field, that is, the magnitude of the write current. Therefore, in the case where the value of the write current is not constant, information cannot be stored in a stable state, or cannot be read out reliably, thereby it can be considered that it cause trouble in operation stability.

As a technique of controlling the supplied current amount according to the resistance of the write line, for example, it is considered that the current value is controlled to be constant on the downstream side of the write current, thereby the current amount which flows through the whole write line can be constant. In other words, as shown in FIG. 25B, the constant current controlling portion 300 is disposed on the ground side of the write line. However, a typical constant current circuit is a circuit using a band gap reference which includes a transistor, a diode or the like, so in this case, the current direction is limited to one direction, so a current cannot flow through one write line in both directions. When a current flows in both directions in the write circuit system, as shown in FIG. 25C, two write lines are bundled, and it is necessary to symmetrically dispose circuit systems. However, it is not impractical, because the circuit structure and the control become complicated. In the current drive of the MRAM, it can be said that controlling the write current in both directions is an indispensable condition, and a task of controlling the write current to a constant value must be accomplished while satisfying the condition. However, as described above, it is not easy to achieve a circuit which satisfies the condition and accomplishes the task, and an effective problem-solving technique has not been proposed.

Moreover, it can be considered that a constant current circuit is disposed in each current drive corresponding to each write line. However, when each current drive independently has the constant current circuit, the power consumption is increased, and variations in a current flowing through each write line may be increased. Moreover, when the constant current circuit is disposed in each current drive, the number of circuit components is increased.

DISCLOSURE OF THE INVENTION

In view of the foregoing, it is an object of the invention to provide a magnetic memory device and a write current drive circuit which are capable of reducing the number of components of a write circuit, variations in a write current flowing through each write line and the power consumption for write operation, and a write current driving method.

A magnetic memory device according to the invention includes: a plurality of magnetoresistive devices including a magnetic sensitive layer of which the magnetization direction changes according to an external magnetic field; a plurality of write lines where a write current for generating an external magnetic field which is applied to the magnetic sensitive layer flows; a plurality of current direction control circuits each of which is disposed for each write line, and has a function of controlling the direction of a write current in each write line according to an inputted write data signal; and a constant current circuit being shared among the plurality of current direction control circuits and making the write current flowing through each write line constant.

In the magnetic memory device, a write current is selectively applied to one of the plurality of write lines. In this case, the direction of the write current in each write line is controlled by the current direction control circuit disposed for each write line. Moreover, the constant current circuit shared among the plurality of current direction control circuits makes the write current flowing through each write line constant. The constant current circuit is shared among the plurality of current direction control circuits, so compared to the case where a constant current circuit is independently disposed for each current direction control circuit, in the magnetic memory device according to the invention, the number of circuit components and variations in the current flowing through each write line can be reduced, and the magnetic memory device according to the invention contributes to reduced power consumption.

In the invention, "to make the write current constant" means constant current control through making not the amount of the write current before flowing into the write line or at the inflow end of the write line but the magnitude of the write current constant throughout the write line from an end of the write line to the other end of the write line.

The current direction control circuit controls the direction of the write current according to an inputted write data signal. In other words, the direction of the write current is changed according to the data signal, and through the use of the write current, the magnetization of the magnetic sensitive layer is controlled in a direction according to the data signal, thereby information is written according to the data signal. In this case, "information" generally means binary information representing "0" or "1" in an input/output signal into the magnetic memory device or "High" or "Low" in a current value or a voltage value, and the current value or the voltage value corresponding to the information is called a data signal.

Each write line has, for example, a loop shape in which both ends of the write line are connected to the current direction control circuit. In the magnetic memory device according to the invention, "connected" means the state of being connected at least electrically, and does not always mean the state of being connected directly and physically.

More specifically, the current direction control circuit preferably includes a first differential switch pair including a first current switch and a second current switch which are disposed corresponding to both ends of the write line, and operate to turn to switching states different from each other; a second differential switch pair including a third current switch and a fourth current switch which are disposed corresponding to the first current switch and the second current switch, respectively, and operate to turn to switching states different from each other; and a differential control means including a fifth current switch and a sixth current switch which operate to turn to switching states different from each other, and controlling to bring the first current switch and the fourth current switch into the same switching state and bring the second current switch and the third current switch into a switching state different from that of the first current switch and the fourth current switch.

In the switching state (on/off state) of a typical switching device, an on state is considered as a conducting state (or a state where the amount of a flowing current is equal to or higher than a threshold) and an off state is considered as a substantially shutdown state in which a current hardly flows (or the sate where the amount of a flowing current is equal to or lower than a threshold). The on state and the off state in this case are steadily determined, and each state can be identified digitally. The "switching state (on/off state)" of the current switch in the invention includes not only such two states but also relative two states which occurs in a pair of current switches as a differential switch pair at the time of differential operation, that is, an on state in which a larger amount of a current flows and an off state in which a smaller amount of a current flows.

In the current direction control circuit, the first current switch and the second current switch of the first differential switch pair are in switching states (on/off states) different from each other. An end of the write line on a side where a corresponding current switch is in an on state is conducted so that a current can flow; however, the other end of the write line on a side where a corresponding current switch is in an off state is blocked so that no current flows. Thus, an end of the write line on a side controlled by a current switch in an on state in the first differential switch pair is selected as a write current inflow side. Moreover, in the second differential switch pair, the third current switch is disposed corresponding to an end of the write line as in the case of the first current switch, and the fourth current switch is disposed corresponding to the other end of the write line as in the case of the second current switch. The third current switch and the fourth current switch are in operation states different from each other, and the second differential switch pair acts as in the first differential switch pair. Thereby, an end of the write line on a side controlled by a current switch in an on state in the second differential switch pair is selected as a write current outflow side.

In the case where the current direction control circuit has such a structure, it is preferable that the first current switch and the fourth current switch operate to turn to the same switching state, and the second current switch and the third current switch operate to turn to a switching state different from that of the first current switch and the fourth current switch. Thereby, the first differential switch pair and the second differential switch pair select an end of the write line as an inflow side and the other end of the write line as an outflow side to determine the direction where a write current flows through the write line. In the invention, "the same switching state" means a state where opening or closing of the switches as a main operation is identical so that a current direction control circuit or the like sufficiently functions, and includes the case where the timing of switching or the like is off to some extent by the response time or the like of the switches or devices connected to the switches.

In the current direction control circuit, the operation of each current switch is controlled by the differential control means, and the first differential switch pair and the second differential switch pair are appropriately driven. Such a differential control means preferably includes a fifth current switch and a sixth current switch which operate to turn to switching states different from each other, because the differential control mean with the most simple structure can perform its function. More specifically, it is preferable that the fifth current switch detects the switching state of the third current switch, and operates the second current switch to turn to the same switching state as that of the third current switch, and the sixth current switch detects the switching state of the fourth current switch, and operates the first current switch to turn to the same current switching state as that of the fourth current switch. Two pairs of current switches which are always in the same switching state exist in the first differential switch pair and the second differential switch pair. The two pairs of current switches are a pair of (the second current switch and the third current switch) and a pair of (the first current switch and the fourth current switch). The operations of two pairs are controlled by the fifth current switch and the sixth current switch, and the two pairs are in switching states different from each other.

Moreover, as a specific structure of the current direction control circuit, the first through the sixth current switches preferably includes the first through the sixth transistors, respectively. As the transistors, any of bipolar transistors, MOSFETs and the like may be used.

In this case, the magnetic memory device according to the invention may further include a circuit selector switch for each current direction control circuit so as to select one of a plurality of current direction control circuit. In this case, it is preferable that the constant current circuit includes a resistor for current control, and a transistor for current control in which the collector terminal thereof is commonly wired to the emitter terminals of the third transistors and the fourth transistors in a plurality of current direction control circuits through the circuit selector switch, and the emitter terminal thereof is grounded through the resistor for current control and a constant voltage is selectively inputted into the base terminal thereof, and the sum of currents flowing through the third transistor and the fourth transistor in a current direction control circuit selected by the circuit selector switch becomes constant by the constant current circuit.

In such a structure, for example, a diode is disposed between the base of the transistor for current control and the ground, and a constant voltage inputted into the transistor for current control can be produced through the use of a band gap reference.

For example, the switching operation of the circuit selector switch is controlled on the basis of a circuit selection signal for selecting one of a plurality of current direction control circuits according to an address value. Moreover, for example, the switching operation of the circuit selector switch may be controlled on the basis of a circuit selection signal according to an address value and a write selection signal indicating a write mode.

In the current direction control circuit, in the case where the first through the sixth current switches include the first through the sixth resistors, respectively, a corresponding relationship between each current switch and the write line is embodied through connecting an end of the write line to the emitter terminal of the first transistor and the collector terminal of the third transistor, and connecting the other end of the write line to the emitter terminal of the second transistor and the collector terminal of the fourth transistor. Moreover, such a current direction control circuit preferably has the following structure including each transistor. For example, the collector terminals of the first transistor and the second transistor may be connected to a power source. The power source and the write line are connected to each other through the first transistor and the second transistor, so a power source current is supplied to the write line from a conduction side according to the switching of the first transistor and the second transistor.

In addition, "power source" in this case means a source of a current or a voltage which is necessary for circuit operation, and an internal power source line of the magnetic memory device. Moreover, a write data signal may be inputted into either the third transistor or the fourth transistor of the second differential switch pair, and an inversion signal of the data signal may be inputted into the other resistor. The "inversion signal" in this case means a signal having a logical value opposite to the data signal. In this case, the third resistor and the fourth resistor are driven on the basis of the data signal to select an current outflow end for allowing a current to flow in a direction corresponding to information to be written.

It is preferable that the base terminals of the fifth resistor and the sixth resistor are connected to the collector terminals of the third resistor and the fourth resistor, respectively, and the collector terminals of the fifth resistor and the sixth resistor are connected to the base terminals of the second resistor and the first resistor, respectively. A potential in the collector terminal of the third transistor is inputted into the base of the fifth transistor so that the fifth transistor operates according to the potential. A potential in the collector terminal of the fifth transistor is inputted into the base of the second transistor so that the second transistor operates according to the potential. Likewise, a potential in the collector terminal of the fourth resistor is inputted into the base of the sixth transistor so that the sixth transistor operates according to the potential. A potential in the collector terminal of the sixth transistor is inputted into the base of the first transistor so that the first transistor operates according to the potential.

In this case, the magnetic memory device according to the invention may further include a second constant current circuit being shared among the plurality of current direction control circuits, and making the sum of currents flowing through the fifth transistor and the sixth transistor constant. In this case, it is preferable that the magnetic memory device according to the invention further includes a second circuit selector switch for each current direction control circuit so as to select one of a plurality of current direction control circuits according to an address value, and the second constant current circuit includes a second resistor for current control and a second transistor for current control in which the collector terminal thereof is commonly wired to the emitter terminals of the fifth transistor and the sixth transistor in the plurality of current direction control circuits through the second circuit selector switch, and the emitter terminal thereof is grounded through the second resistor for current control and a constant voltage is selectively inputted into the base terminal thereof.

By such a structure, a circuit portion including the fifth transistor and the sixth transistor (differential control means) operates as a differential amplification circuit having a current path which is independent of the first through the fourth transistors (the first and the second differential switch pairs).

The magnetoresistive device in the magnetic memory device according to the invention includes, for example, a laminate which includes the magnetic sensitive layer and through which a current flows in a direction perpendicular to a laminate surface; and a toroidal magnetic layer which is disposed on one surface of the laminate so that its direction along the laminate surface is its axial direction and the write line passes through the toroidal magnetic layer. In this case, "an external magnetic field" means not only a magnetic field generated by a current flowing through the write line but also a rotating magnetic field generated in the toroidal magnetic layer. Moreover, "toroidal" in the "toroidal magnetic layer" shows a state where the toroidal magnetic layer is magnetically and electrically continuous to completely surround the write line passing through the interior of the toroidal magnetic layer, and the sectional surface of the toroidal magnetic layer in a direction across the write line is closed. Therefore, the toroidal magnetic layer is allowed to include an insulator as long as it is magnetically and electrically continuous, and may include an oxide film to an extent in which the formation of the oxide film occurs in a manufacturing process. The "axial direction" indicates an opening direction when attention is given to the toroidal magnetic layer, that is, an extending direction of the write line passing through the interior of the toroidal magnetic layer. Moreover, "disposed on one surface of the laminate" included not only the case where the toroidal magnetic layer is disposed as a separate body from the laminate on one surface of the laminate, but also the case where the toroidal magnetic layer is disposed so as to include a part of the laminate. Such a magnetoresistive device forms a closed magnetic path in the toroidal magnetic layer, when a current flows through the write line. Thereby, the magnetization is efficiently reversed.

In the case where the magnetoresistive device has such a structure, it is preferable that the write line includes a plurality of first write lines and a plurality of second write lines extending so as to intersect with the plurality of first write lines, and the first write lines and the second write lines extend in parallel to each other in a region where the first write lines and the second write lines pass through the toroidal magnetic layer. The magnetoresistive device is selected when a current flows in the same direction in a parallel portion of the first and the second write line, that is, in a region of the toroidal magnetic layer, thereby information is written. At this time, an induced magnetic field generated by the first and the second write lines is generated in the same direction so as to be reinforced.

Moreover, in the magnetic memory device according to the invention, one memory cell may include a pair of the magnetoresistive devices. Two magnetoresistive devices which can store one unit of information independently are used to store one unit of information.

In the magnetic memory device, it is preferable that the magnetization directions of magnetic sensitive layers in the pair of magnetoresistive devices change according to a magnetic field induced by a current flowing through the first write line and the second write line so as to be antiparallel to each other, thereby information is stored in the memory cell. In the invention, "the magnetization directions are antiparallel to each other" includes the case where an angle between the magnetization directions, that is, the directions of average magnetization in the magnetic layers is strictly 180 degrees, and the case where an angle between the magnetization directions is deviated by a predetermined angle from 180 degrees due to an error generated during manufacturing or an error because the magnetic layers are not perfectly uniaxial. In the magnetic memory device, the magnetization of the magnetic sensitive layers in the pair of magnetoresistive devices are in either of two states, that is, a state in which they face each other and a state in which they are opposite to each other, and binary information corresponds to the state.

The write current drive circuit according to the invention is applied to a magnetic memory device, the magnetic memory device including a plurality of magnetoresistive devices including a magnetic sensitive layer of which the magnetization direction changes according to an external magnetic field, and a plurality of loop-shaped write lines where a write current for generating an external magnetic field which is applied to the magnetic sensitive layer flows, and the write current drive circuit includes a pair of connection ends to which both ends of the write line are connected; a plurality of current direction control circuits each of which is disposed for each write line, and has a function of controlling the direction of a write current in each write line according to an inputted write data signal; and a constant current circuit being shared among the plurality of the current direction control circuits, and making the write current flowing through each write line constant.

The current direction control circuit and the constant current circuit in the write current drive circuit have the same structure as those included in the magnetic memory device according to the invention. In the write current drive circuit, as in the case of the magnetic memory device according to the invention, the constant current circuit is shared among a plurality of current direction control circuits, so compared to the case where the constant current circuit is independently disposed for each current direction control circuit, in the write current drive circuit, the number of circuit components and variations in the write current flowing through each write line can be reduced, and the write current drive circuit contributes to reduced current consumption.

A write current driving method according to the invention is applied to a magnetic memory device, and the magnetic memory device included a plurality of magnetoresistive devices including a magnetic sensitive layer of which the magnetization direction changes according to an external magnetic field, and a plurality of loop-shaped write lines where a write current for generating the external magnetic field which is applied to the magnetic sensitive layer flows, and a current direction control circuit is disposed for each write line, and both ends of the write line are connected to the current direction control circuit, and a constant current circuit is shared among the plurality of current direction control circuits, and the current direction control circuit controls the direction of a write current in each write line according to an inputted write data signal, and the constant current circuit makes the write current flowing through each write line constant.

In the write current driving method, the constant current circuit is shared among a plurality of current direction control circuit, so compared to the case where the constant current circuit is independently disposed in each current direction control circuit, the number of circuit components and variations in the write current flowing through each write line can be reduced, and the write current driving method contributes to reduced current consumption.

BRIEF DESCRIPTION OF THE DRAWINGS

FIGS. 14A through 14F are timing charts showing the operation of a X-direction current drive during the write operation shown in FIG. 12;

FIG. 25A is an illustration showing a relationship between the current drive shown in FIG. 24 and a write line; FIG. 25B is a schematic structural view of a system including a current drive and a write line according to a modification; and FIG. 25C is a schematic structural view of a write circuit system designed for solving problems in the circuit system of FIGS. 25A and 25B.

BEST MODE FOR CARRYING OUT THE INVENTION

A preferred embodiment of the present invention will be described in more detail below referring to the accompanying drawings.

Figure 1:
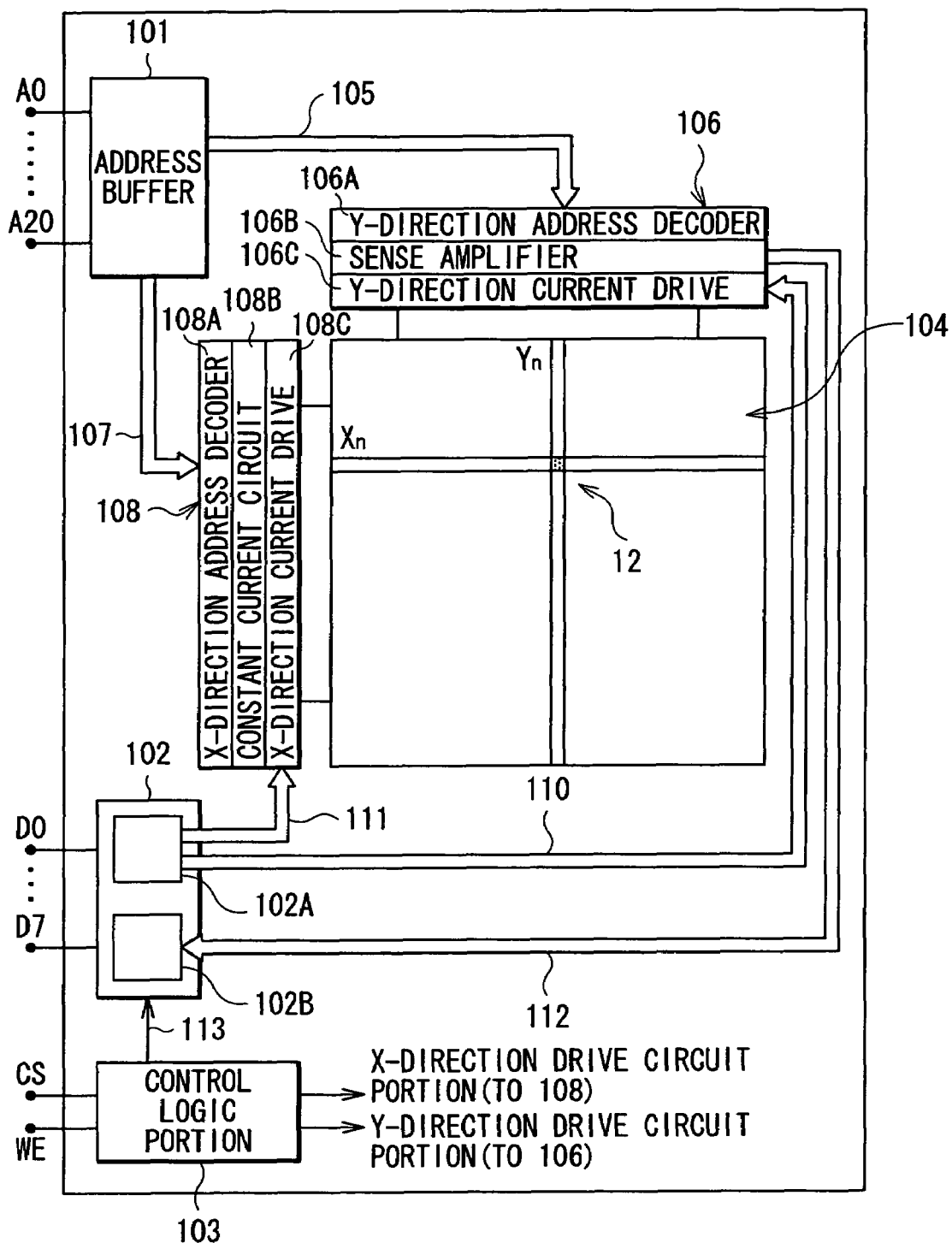
FIG. 1 is a block diagram showing the whole structure of a magnetic memory device according to an embodiment of the invention.

FIG. 1 shows an illustration of the whole structure of a magnetic memory device according to an embodiment of the invention. The magnetic memory device is an MRAM implemented as a so-called semiconductor memory chip, and includes an address buffer 101, a data buffer 102, a control logic portion 103, a memory cell group 104, a Y-direction drive circuit portion 106 and an X-direction drive circuit portion 108 as main components.

In the memory cell group 104, a large number of memory cells 12 are arranged in a word line direction (X direction) and a bit line direction (Y direction) in a matrix form as a whole. Each memory cell 12 is a minimum unit for storing data, and the memory cell 12 stores bit data "1" or "0". In the description, each row and each column of the memory cells 12 in the memory cell group 104 are called word array Xn and bit array Yn, respectively.

The Y-direction drive circuit portion 106 includes a Y-direction address decoder 106A, a sense amplifier 106B for read operation and a Y-direction current drive 106C for write operation, each of which is connected to each bit array Yn (Y1, Y2, . . . ) of the memory cells 12 in the memory cell group 104.

The X-direction drive circuit portion 108 includes an X-direction address decoder 108A, a constant current circuit 108B for read operation and an X-direction current drive 108C for write operation, each of which is connected to each word array Xn (X1, X2, . . . ) of the memory cells in the memory cell group 104. Therefore, for example, as shown in the drawing, one memory cell 12 is uniquely selected by an address (Xn, Yn) in a word direction and a bit direction inputted from the X-direction address decoder 108A and the Y-direction address decoder 106A.

The address buffer 101 includes external address input terminals A0 through A20, and is connected to the Y-direction address decoder 106A and the X-direction address decoder 108A through address lines 105 and 107. The address buffer 101 has a function of taking a selection signal for selecting the memory cell 12 from the external address input terminals A0 through A20 to amplify the signal to a voltage level necessary in the address decoders 106A and 108A by an internal buffer amplifier. Moreover, the amplified selection signal is divided into two selection signals in the word line direction (X direction) and the bit line direction (Y direction) of the memory cell 12, and the two selection signals are inputted into the address decoders 106A and 108A, respectively. In the case where the magnetic memory device includes a plurality of memory cell groups 104, an address signal for selecting one memory cell group 104 among the plurality of memory cell groups 104 is inputted into the address buffer 101.

The data buffer 102 includes external data terminals D0 through D7 for exchanging a digital data signal with an external component, and is connected to a control logic portion 103 through a control signal line 113. The data buffer 102 includes an input buffer 102A and an output buffer 102B, and the input buffer 102A and the output buffer 102B is activated by a control signal from the control logic portion 103. The input buffer 102 is connected to the Y-direction current drive 106C and the X-direction current drive 108C through write data buses 110 and 111, and the input buffer 102 has a function of taking a data signal from the external data terminals D0 through D7 at the time of memory writing to amplify the data signal to a voltage level necessary by the internal buffer amplifier, thereby to output the amplified data signal to the current drives 106C and 108C. The output buffer 102B is connected to the sense amplifier 106B through a read data bus 112, and has a function of outputting a read data signal inputted from the sense amplifier 106B at the time of memory reading to the external data terminals D0 through D7 at a low impedance through the use of the internal buffer amplifier.

The control logic portion 103 includes an input terminal CS and an input terminal WE, and is connected to the data buffer 102 through the control signal line 113. The control logic portion 103 controls the operation of the memory cell group 104, and a signal (a chip select; CS) indicating whether or not to make the write/read operation of the magnetic memory device active is inputted into the control logic portion 103 from the input terminal CS. Moreover, a write enable signal (write enable; WE) for switching between the write operation and the read operation is inputted into the control logic portion 103 from the input terminal WE. The control logic portion 103 has a function of amplifying a signal voltage inputted from the input terminal CS and the input terminal WE to a voltage level necessary in the drive circuit portions 106 and 108 by the internal buffer amplifier, and the control logic portion 103 sends the amplified signal to the drive circuit portions 106 and 108.

Figure 2:
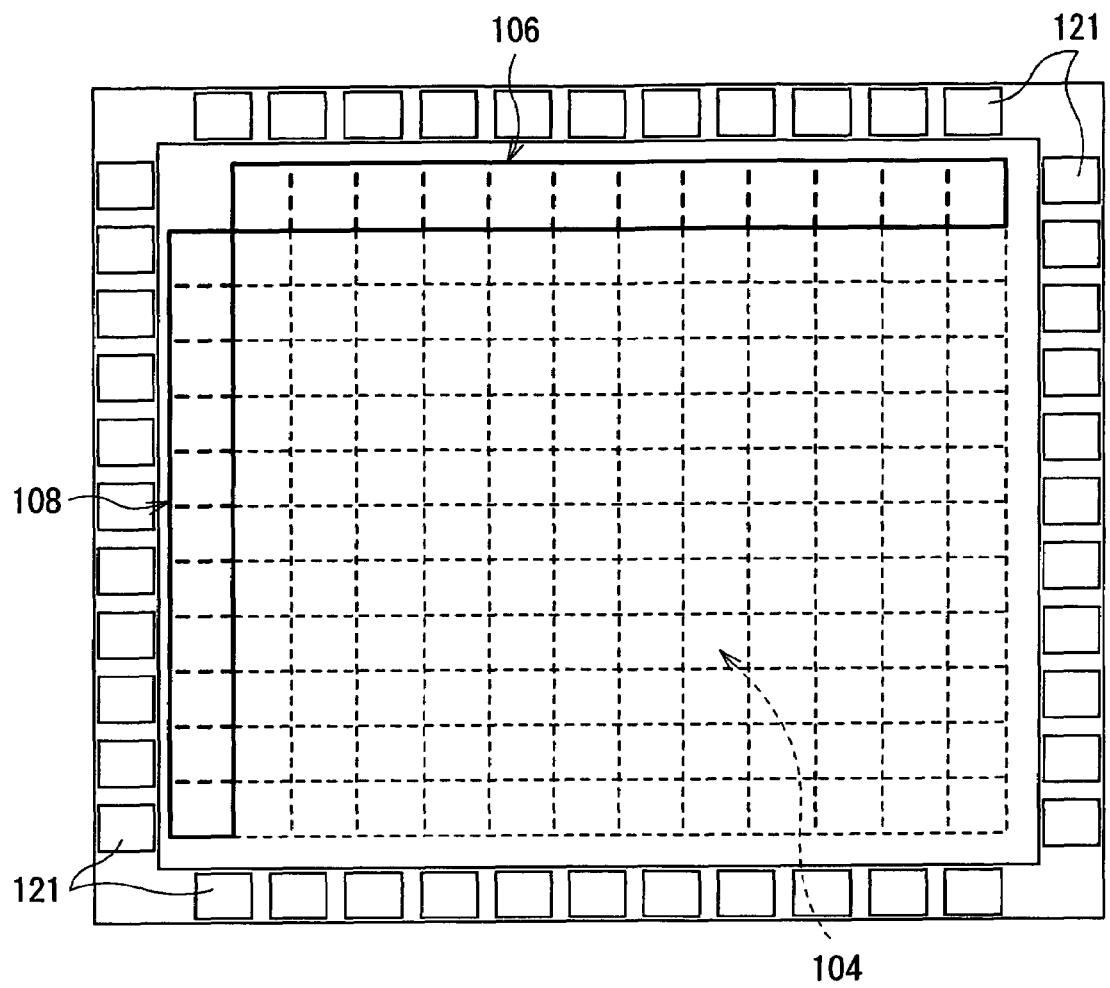
FIG. 2 is a plan view showing a main part of the magnetic memory device shown in FIG. 1.

The specific arrangement of the main components of the magnetic memory device is as shown in FIG. 2, for example. The outermost frame in the drawing indicates a die cutout line. The memory cell group 104 is disposed in a wide region in the center of a silicon chip, and circuits for driving the memory cell group 104 such as the drive circuit portions 106 and 108 are mounted in a small region around the wide region. The circuits are connected to a control portion of the whole device or an external component through bonding pads 121. Moreover, in this case, the X-direction drive circuit portion 108 is disposed on the left side of the memory cell group 104 and the Y-direction drive circuit portion 106 is disposed on the top side of the memory cell group 104.

[Structure of write circuit]

Figure 3:
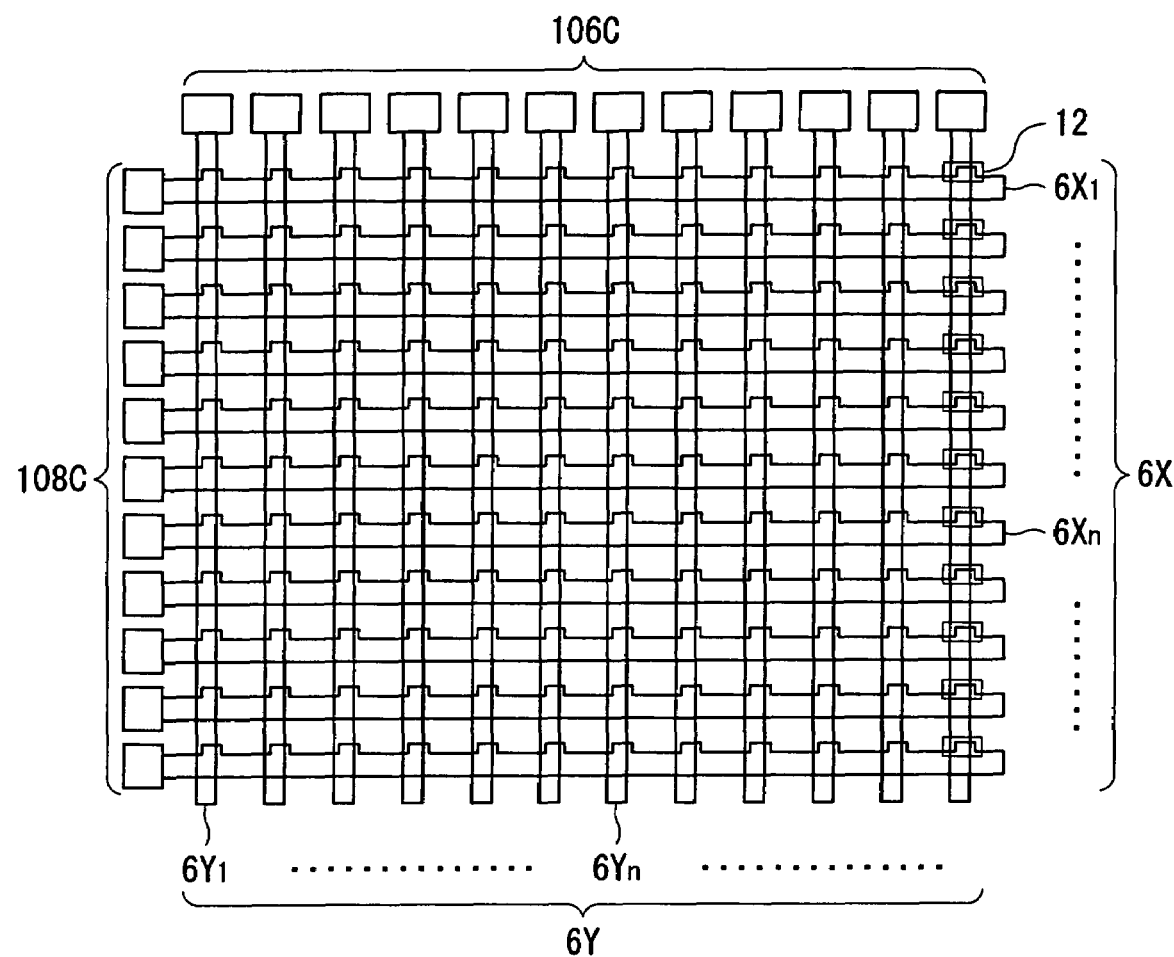
FIG. 3 is a structural view of a write circuit system of the magnetic memory device shown in FIG. 1.

FIG. 3 shows a positional relationship between the current drives and write lines of the memory cells. A current is supplied to each memory cell 12 from the X-direction current drive 108C and the Y-direction current drive 106C through each of a plurality of write bit lines 6Y (6Y1, . . . , 6Yn, . . . ) extending in a Y direction and each of a plurality of write word lines 6X (6X1, . . . , 6Xn, . . . ) extending in a X direction so as to intersect with the plurality of write bit lines 6Y, thereby information is written into the memory cell 12.

Each of the write word lines 6X and each of the write bit lines 6Y are disposed so as to be formed in a U-shaped loop. Moreover, each write word line 6X has a portion which is bent every time either the outward route or the homeward route of the write word line 6X intersects with the write bit lines 6Y so as to be parallel to the write bit lines 6Y. In this case, a magnetoresistive device is disposed in each region where the parallel portion is formed, and one memory cell 12 includes a pair of magnetoresistive devices 12A and 12B (refer to FIG. 6) disposed in a pair of parallel portions each of which includes one write word line 6X and one write bit line 6Y. In the following description, the write word lines 6X and the write bit lines 6Y are abbreviated as write lines 6X and 6Y, respectively, and when they are generically called irrespective of directions, they are simply called write lines 6.

The X-direction current drive 108C and the Y-direction current drive 106C are constant current source circuits for supplying a predetermined amount of current to the write word lines 6X and the write bit lines 6Y at the time of writing information into the memory cell 12. In this case, both ends of each write word line 6X are connected to one of the X-direction current drives 108C, and both ends of each write bit line 6Y are connected to one of the Y-direction current drives 106C. In other words, the arrangement of the write word line 6X (6X1, . . . , 6Xn, . . . ) and the X-direction current drive 108C corresponds to one word array Xn of the memory cells 12. Likewise, the arrangement of the write bit line 6Y (6Y1, . . . , 6Yn, . . . ) and the Y-direction current drive 106C corresponds to one bit array Yn of the memory cells 12.

(Structure of Current Drive)

Figure 4:
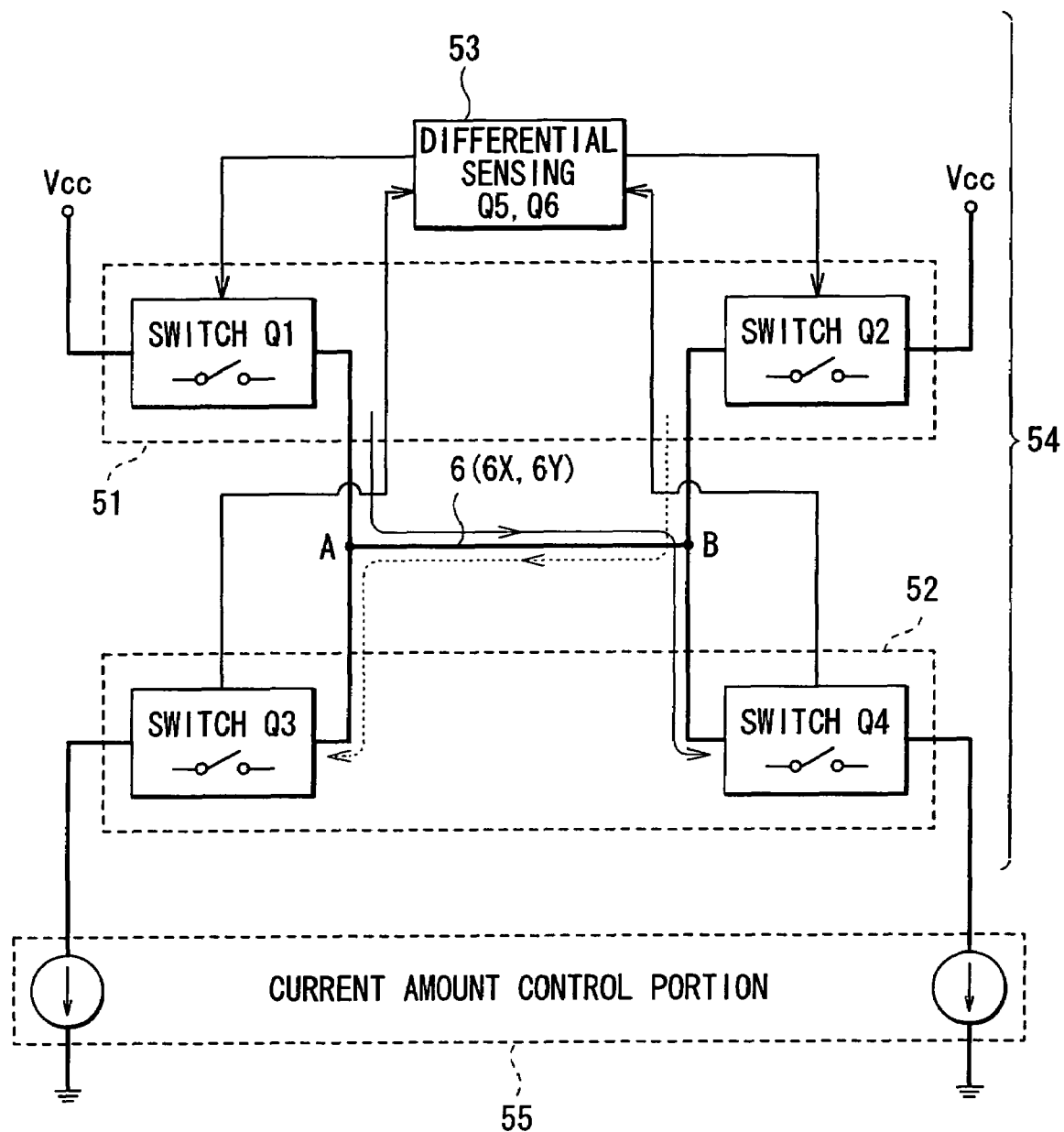
FIG. 4 is a conceptual structural view for describing a function of a current drive in the magnetic memory device shown in FIG. 1.

The current drives 108C and 106C have (1) a function as a switch for controlling the direction of a current flowing through the write lines 6X and 6Y, and (2) a function of fixing the current amount to a constant value (a constant current function for making a write current constant). FIG. 4 shows a conceptual structural view of a current drive according to an embodiment focusing attention on (1) the switching function for controlling the current direction of the write line and (2) the constant current control function in the write line.

Figure 5:
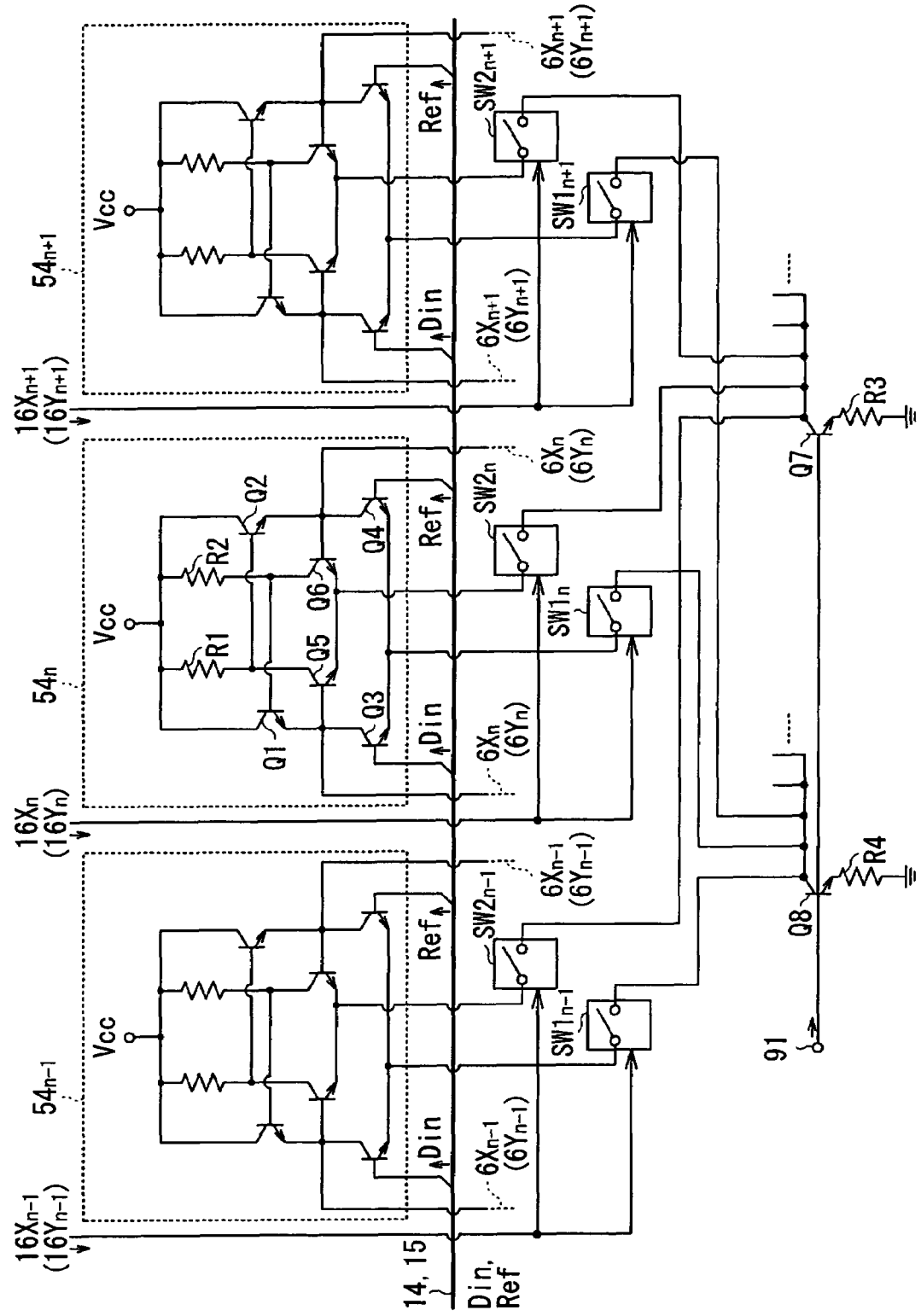
FIG. 5 is a circuit diagram of the current drive in the magnetic memory device shown in FIG. 1.

In the current drive, (1) the function of controlling the current direction can be achieved by a current direction control portion (current direction control circuit) 54 including a first and a second differential switch pairs 51 and 52 and a differential control means 53. As shown in FIG. 5 which will be described later, the current direction control portion 54 is disposed for each write line 6. In the embodiment, the write lines 6 include both write lines 6Xn−1, 6Xn and 6Xn+1 and the write lines 6Yn−1, 6Yn, and 6Yn+1 in the drawing.

The first differential switch pair 51 include switches Q1 and Q2, and each of the switches Q1 and Q2 is disposed between a power source Vcc and end portions A and B of the write line 6, and when either of them is in an on state, and the other is in an off state, the power source Vcc is connected to only either of the end portions A and B to flow a current through the write line 6. The second differential switch pair 52 includes switches Q3 and Q4, and each of the switches Q3 and Q4 is disposed between the end portions A and B of the write line 6 and the ground, and when either of them is in an on state, and the other is in an off state, only either of the end portions A and B is conducted to the ground to discharge a current.

Therefore, while the switch Q1 and the switch Q4 are closed, and the switch Q2 and the switch Q3 are opened, a current flows through the write line 6 in a solid line direction. On the other hand, while the switch Q1 and the switch Q4 are opened, and the switch Q2 and the switch Q3 are closed, a current flows through the write line 6 in a dotted line direction. In other words, in this case, in order to control the current flowing through the write line 6 in both directions, it is necessary that the switch Q1 and the switch Q4 are in the same operation state, and the switch Q2 and the switch Q3 is in an operation state opposite to the operation state of the switches Q1 and Q4. Thus, the first and the second differential switch pairs 51 and 52 perform switching operations which are complementary to each other, thereby the first and the second differential switch pairs 51 and 52 can control the current direction.

In this case, the operations of the first and the second differential switch pairs 51 and 52 are controlled by the differential control means 53. The differential control means 53 allows the two differential switch pairs 51 and 52 to operate in cooperation with each other by a method of differentially sensing the operation state of either of the first and the second differential switch pairs 51 and 52, and controlling the operation of the other differential switch pair according to the sensing result (for example, controlling the on/off states of the switches Q1 and Q2 according to the on/off states of the switches Q3 and Q4).

The simplest structure of the differential control means 53 can be formed in the case where the differential control means 53 includes a pair of switching devices. For the purpose of describing a basic operation of the differential control means 53, the differential control means 53 includes switches Q5 and Q6, which are called a third differential switch pair. More specifically, the switches Q5 and Q6 differentially sense the switches Q3 and Q4, and control the switches Q1 and Q2 according to the result so that the switch Q2 is in the same on/off state as that of the switch Q3, and the switch Q1 is in the same on/off state as that of the switch Q4.

On the other hand, (2) the constant current control in the write line of the current drive according to the embodiment is performed by a current amount control portion 55 disposed on a ground side of the write line 6. The current amount control portion 55 is disposed as a common component for a plurality of current direction control portions 54.

The current amount control portion 55 is disposed closer to the ground than the write line 6, and fixes the amount of a current flowing from the write line 6. The amount of a current flowing from the write line 6 is the current amount in the write line 6, so regardless of the resistance, a constant amount of a current flows through the write line 6. In FIG. 4, the current amount control portion 55 is shown as a constant current circuit disposed each between the switches Q3 and Q4 and the ground. It is an expression of an equivalent circuit for describing the function, and in the actual circuit structure, as shown in FIG. 5, the current amount control portion 55 may be one constant current circuit commonly wired to the emitter terminals of the transistor Q3 and the transistor Q4 through a first circuit selector switch SW1.

Next, on the basis of FIG. 5, the functional structure of the current drive according to the embodiment will be described in contrast with FIG. 4. FIG. 5 shows a specific structure of the current drive according to the embodiment.

The X-direction current drive 108C and the Y-direction current drive 106C have a structure shown in the drawing, and the transistors Q1 through Q6 correspond to the switches Q1 through Q6 shown in FIG. 4, respectively. Moreover, both ends of the write bit line 6X are connected between the drive point A and the drive point B of the X-direction current drive 108C, and both ends of the write bit line 6Y are connected between the drive point A and the drive point B of the Y-direction current drive 106C. The current direction control portion 54 ( . . . , 54n, 54n+1, . . . ) is disposed for each of the write lines 6X ( . . . , 6Xn, 6Xn+1, . . . ) and 6Y ( . . . , 6Yn, 6Yn+1, . . . ); however, the structure of circuit components in the current direction control portion 54 is all the same, so in FIG. 5, only circuit components in the nth current direction control portion 54n are denoted by symbols.

The constant current circuit corresponding to the current amount control portion 55 in FIG. 4 includes the transistor Q8 and the resistor R4. In a circuit example of FIG. 5, the transistor Q7 and the resistor R3 constitute a constant current circuit (a second constant current circuit) to determine the total current of the transistors Q5 and Q6. The transistor Q8 and the transistor Q7 correspond to specific examples of "a first transistor for current control" and "a second transistor for current control" in the invention. The resistor R4 and the resistor R3 correspond to specific examples of "a first resistor for current control" and "a second resistor for current control" in the invention.

The transistor Q8 and the resistor R4 constituting a constant current circuit are disposed as common components for a plurality of current direction control portions 54n−1, 54n, 54n+1, . . . . The transistor Q7 and the resistor R3 constituting a constant current circuit are disposed as common components for a plurality of current direction control portions 54n−1, 54n, 54n+1, . . . . The constant current circuits are connected to each current direction control portion 54 through the first circuit selector switch SW1 ( . . . , SW1n, SW1n+1, . . . ) and the second circuit selector switch SW2 ( . . . , SW2n, SW2n+1, . . . ) disposed in each current direction control portion 54. Moreover, a decode signal voltage is applied to the constant current circuits from a word decode line 16X (bit decode line 16Y) through the circuit selector switches SW1 and SW2. In the embodiment, at the stage before the current drive 108C (106C), a decode signal inputted into the word decode line 16X (bit decode line 16Y) is designed to be a constant voltage, for example, 1.5 V, so the current amount flowing through the transistor Q8, the resistor R4, the transistor Q7 and the resistor R3 becomes constant.

On a specific circuit shown in FIG. 5, the operations of the differential switch pairs 51 through 53 described referring to FIG. 4 are performed in a complementary manner between a system including the transistors Q3, Q5 and Q2 and a system including the transistor Q4, Q6 and Q1, and by differential sensing of the transistors Q5 and Q6, either a combination of (the transistors Q3 and Q2) or a combination of (the transistors Q4 and Q1) is in an on state, and the other combination is in an off state. Moreover, the base terminals of the transistors Q3 and Q4 are connected to a data signal line 14 (Din) and a reference signal line 15 (Ref) to perform switching on the basis of data to be written. In other words, the transistors Q5 and Q6 differentially sense the on/off states of the transistors Q3 and Q4 which are operated through inputting a data signal, and according to the result, the transistors Q5 and Q6 control the operations of the transistors Q1 and Q2 so that the transistor Q1 is in the same state as that of the transistor Q4, or the transistor Q2 is in the same state as that of the transistor Q3.

Figure 25A:
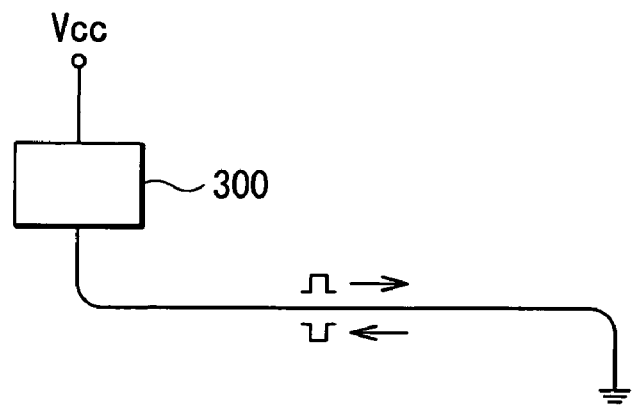
FIGS. 25A through 25C are illustrations for describing problems in controlling a write current in a related art.
Figure 25B:
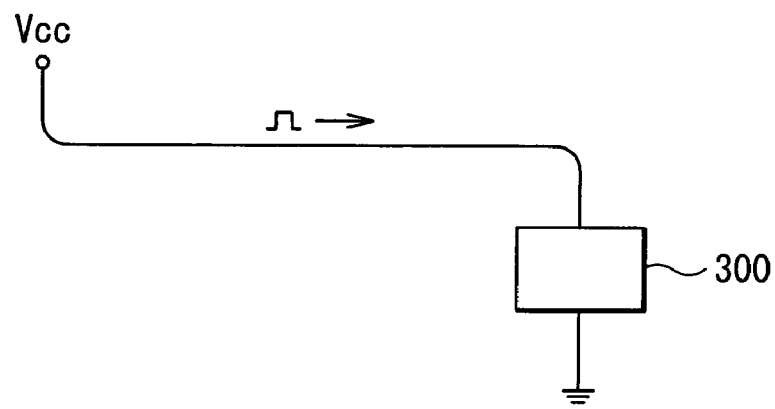
Figure 25C:
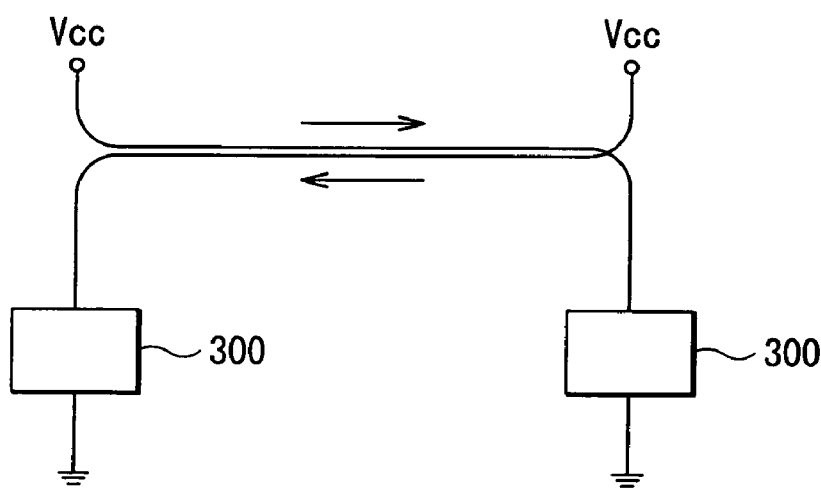

Thus, in the structure shown in FIGS. 4 and 5, the current drives 108C and 106C can have (1) the direction control function and (2) the constant current control function for the write current, and the effect of variations in resistance of the write line can be prevented, and a constant current can be stably applied to the write lines. Further, the first and the second constant current circuits (the transistor Q8 and the resistor R4, and the transistor Q7 and the resistor R3) are common components for a plurality of current direction control portions 54n−1, 54n, 54n+1, . . . , so a constant current can be applied more stably. In a current drive in a related art, as described above, the current amount is controlled before supplying the current to the write line, so the current drive in the related art cannot control the current amount as perfectly as the structure shown in FIGS. 4 and 5. The structure of the current drive according to the embodiment can be considered to be equivalent to a dual circuit system (refer to FIG. 25C) shown as a modification of the current drive in the related art. The symmetric function structure of the dual circuit system can be achieved by one circuit system including a symmetric differential switch pair with one write line.

The arrangement of components of the current drive shown in FIG. 5 and the connection relationship between the components will be described below.

The collector-emitters of the transistors Q1 and Q2 which function as a differential pair for amplification in a later stage and the base terminals of the transistors Q5 and Q6 are connected between the collector terminals of the transistors Q3 and Q4 and the power source Vcc from a side closer to the power source Vcc, and the drive points A and B where both ends of the write word line 6X (or the write bit line 6Y) are drawn are disposed. The base terminal of the transistor Q1 and the base terminal of the transistor Q2 are connected crosswise to the collector of the transistor Q6 and the collector of the transistor Q5, respectively.

The emitter terminals of the transistors Q3 and Q4 are connected to the first circuit selector switch SW1, the collector-emitter of the transistor Q8 and the resistor R4 in series, and are grounded through them. The transistor Q8 functions as a semiconductor switch which will be described later. The transistor Q8 and the resistor R4 have a current control function. The first circuit selector switch SW1 includes, for example, a bipolar semiconductor switch.

Figure 15:
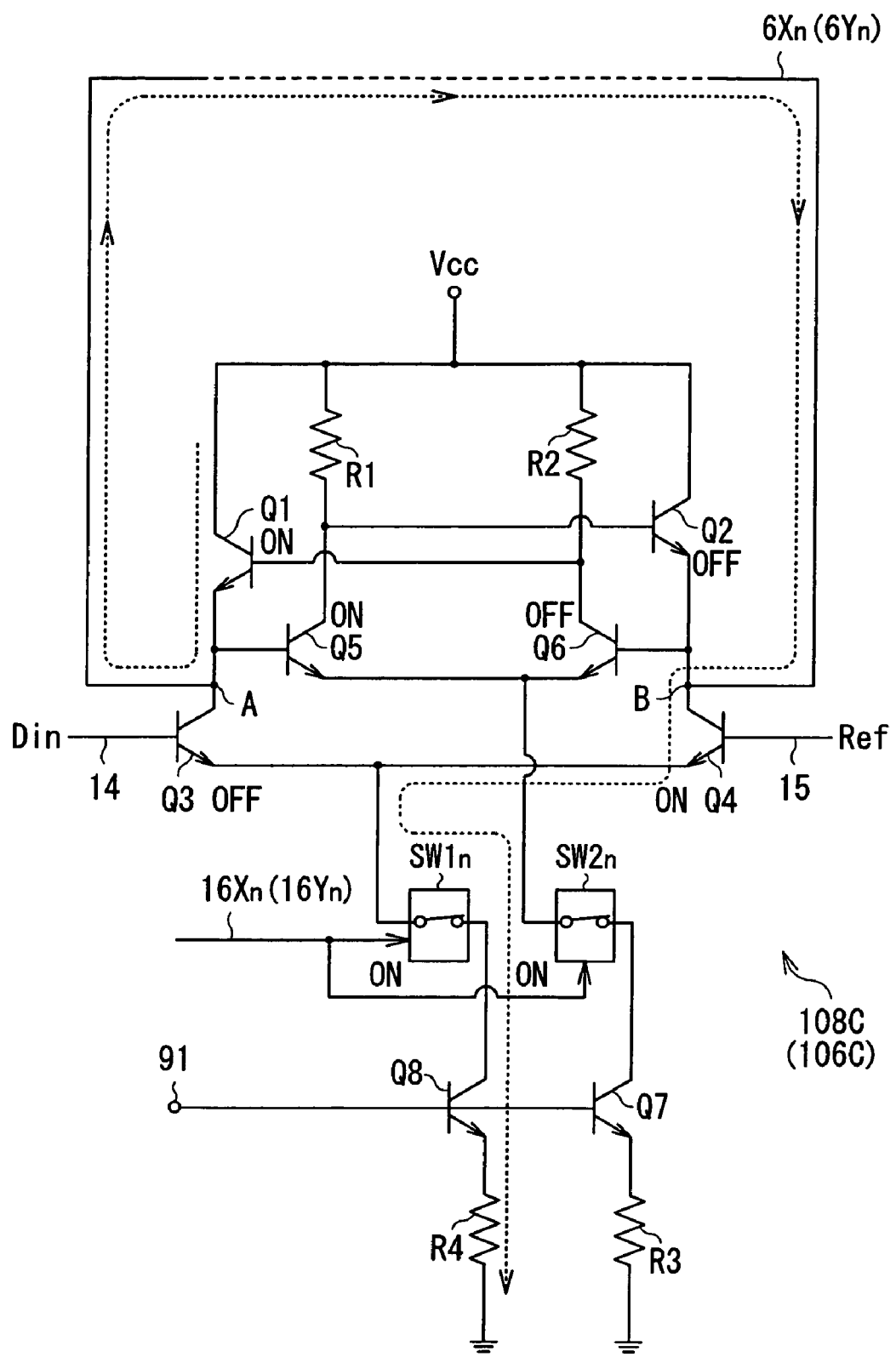
FIG. 15 is an illustration showing the operation state of each transistor of the X-direction current drive during the write operation shown in FIG. 12 and the route of a write current.

A data signal line 14 (Din) where a data signal according to data to be written is inputted is connected to the base terminal of the transistor Q3. On the other hand, a reference signal line 15 (Ref) where a reference signal produced through inverting the data signal is inputted is connected to the base terminal of the transistor Q4. In FIG. 5, the data signal line 14 and the reference signal line 15 are shown as one bus signal line for the sake of simplification; however, actually they are separate signal lines as shown in FIG. 15 which will be described later. Moreover, a current flowing through the signal lines 14 and 15 through inputting each signal flows into the base-emitters of the transistors Q3 and Q4 so that a circuit portion including the transistors Q3 and Q4 and the transistor Q8 acts as a differential amplifier. Moreover, in order to appropriately perform the differential operation of transistor pairs including the transistors Q3 and Q4, one of the voltage amplitudes of the data signal and the reference signal is φ (V) higher than the emitter potential common to the transistors Q3 and Q4, and the other is equal to or less than the emitter potential, or 0.2 V or less higher than the emitter potential at the highest.

The collector terminals of the transistors Q5 and Q6 are connected to the power source Vcc through the resistors R1 and R2 which function as bias resistors (first and the second bias resistors). Moreover, the emitter terminals of the transistors Q5 and Q6 are connected to the second circuit selector switch SW2, the collector-emitter of the transistor Q7 and the resistor R3 in series, and to the ground. The transistor Q7 functions as a semiconductor switch which will be described later. The transistor Q7 and the resistor R3 have a current control function. The second circuit selector switch SW2 includes, for example, a bipolar semiconductor switch.

The circuit selector switches SW1 and SW2 select one of a plurality of current direction control circuits 54, and are disposed for each current direction control circuit 54. The circuit selector components are donated by like numerals of the switch shown in FIG. 18, and will not be further described.

Figure 20:
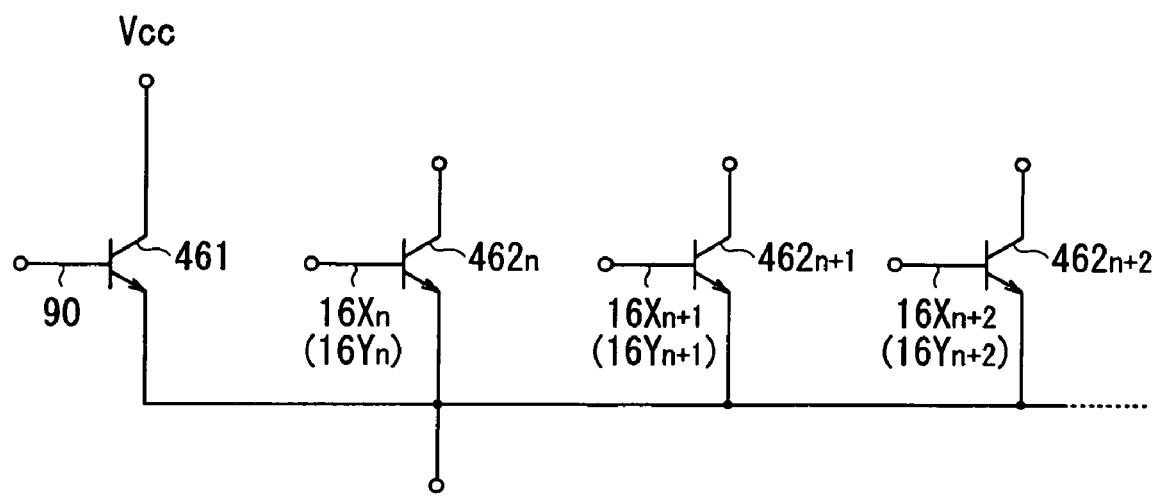
FIG. 20 is a structural view of a third modification of the current drive shown in FIG. 5.

In the switch shown in FIG. 20, a plurality of transistors 462 ( . . . , 462*n*, 462*n*+1, . . . ) are disposed corresponding to each current direction control portion 54, and each transistor 462 is connected to the base terminal of the word decode line 16X (bit decode line 16Y). On the other hand, only one transistor 461 connected to the write selection signal line 90 is disposed. The emitters of the transistors 461 and 462 are commonly connected in parallel, and the transistor 461 is shared among the plurality of transistors 462 ( . . . , 462*n*, 462*n*+1, . . . ).

Figures 18, 19:
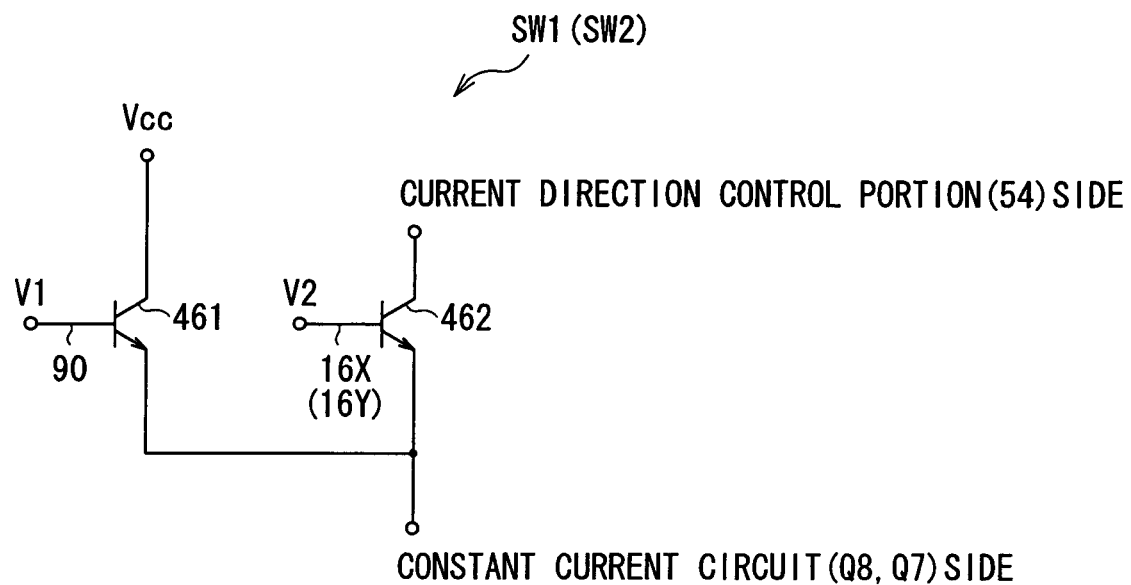
FIG. 18 is an illustration showing a specific example of the structure of a switch in the current drive shown in FIG. 17.
FIG. 19 is a table for describing the operation of the switch shown in FIG. 18.

The switch acts as shown in FIG. 19 as in the case of the switch shown in FIG. 18. In other words, when "Low" (write command) is inputted into the transistor 461 as a write selection signal, and a circuit selection signal (decode signal) of a "High" level is inputted into one of the transistors 462 ( . . . , 462*n*, 462*n*+1, . . . ), the selected transistor 462 is conducted. For example, when the decode value Xn is inputted from the word decode line 16Xn, only the transistor 462*n* is conducted, and the current drive corresponding to the bit array Xn becomes active. When "High" is inputted into the transistor 461, even if the decode value is inputted, all transistors 462 remains shut down.

The invention is not limited to the above embodiment, and can be variously modified. For example, in the magnetic memory switches SW1 and SW2 control switching on the basis of a circuit selection signal for selecting one of the plurality of current direction control circuits 54. More specifically, the address decode value of a target memory cell 12 as a circuit selection signal is inputted into the circuit selector switches SW1 and SW2. In other words, in the X-direction current drive 108C, the word decode line 16X (16X1, . . . , 16Xn, . . . ) is connected to the circuit selector switches SW1 and SW2 from the X-direction address decoder 108A, and a decode value for selecting a word array Xn of the memory cells 12 is inputted from the X-direction address decoder 108A through the word decode line 16X.

Likewise, in the Y-direction current drive 106C, the bit decode line 16Y (16Y1, . . . , 16Yn, . . . ) is connected to the circuit selector switches SW1 and SW2 from the Y-direction address decoder 106A, and a decode value for selecting a bit array Yn of the memory cells 12 is inputted from the Y-direction address decoder 106A through the bit decode line 16Y.

In the current drive 108C (106C), when one of the plurality of current direction control circuits 54 is selected by the circuit selector switches SW1 and SW2, the first and the second constant circuits (the transistor Q8 and the transistor R4, and the transistor Q7 and the resistor R3) which are common circuits for the plurality of current direction control circuits 54 act in corporation with the selected current direction control circuit 54.

The base terminals of the transistors Q7 and Q8 are connected to a constant current circuit control terminal 91, and the transistors Q7 and Q8 function as semiconductor switches which perform switching on the basis of a control signal inputted through the constant current circuit control terminal 91.

A control signal with a voltage level which can bring the transistors Q7 and Q8 into a shutdown state is selectively inputted into the constant current circuit control terminal 91, and according to the control signal, all current drives 108C (106C) sharing the transistors Q7 and Q8 can be controlled to be in an active state or an inactive state.

(Structure of Memory Cell)

Figure 6:
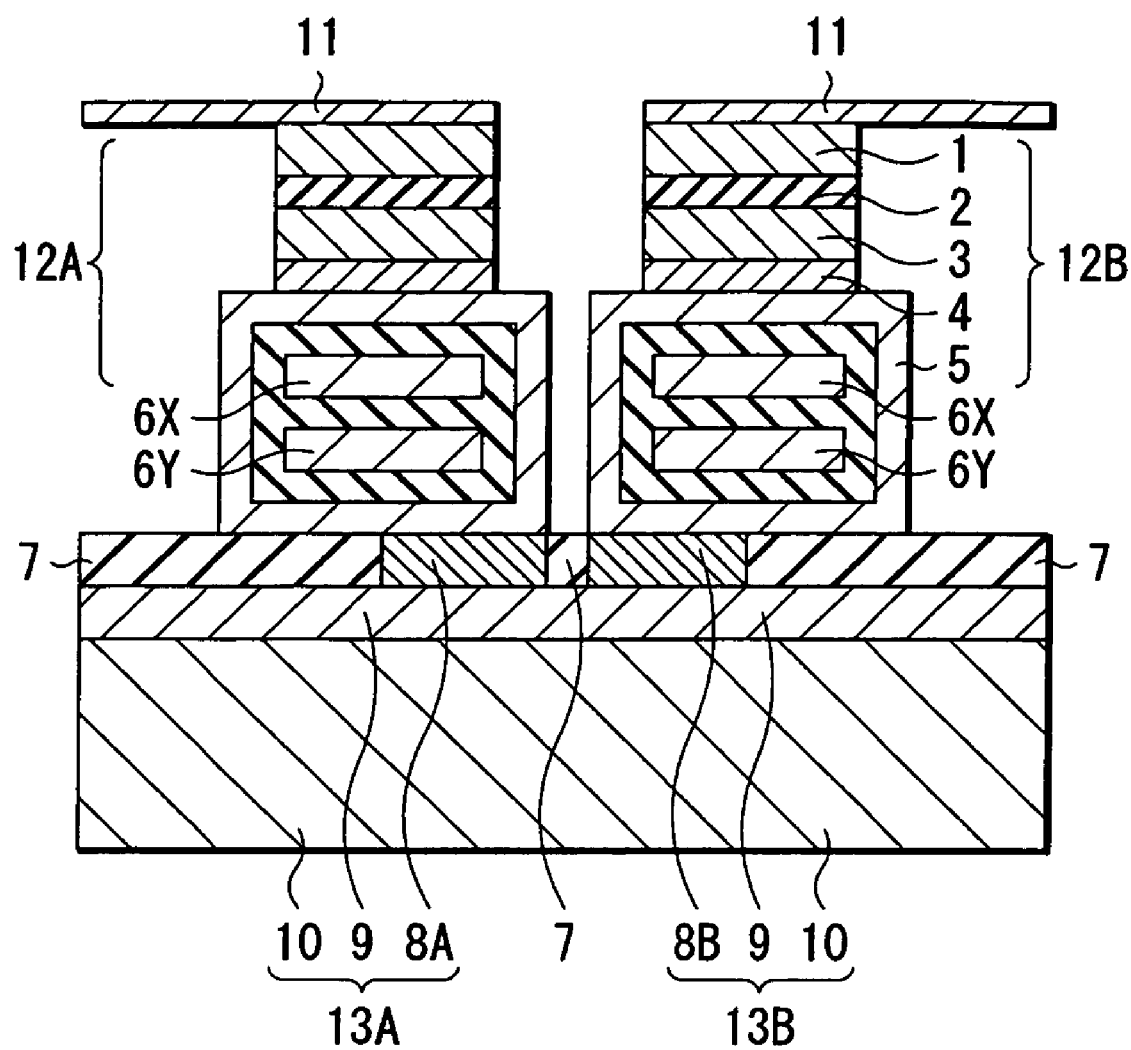
FIG. 6 is a sectional view of a specific structure of a memory cell in the magnetic memory device shown in FIG. 1.

FIG. 6 shows a sectional view of the structure of a memory cell according to the embodiment. The magnetoresistive devices 12A and 12B of each memory cell 12 are magnetoresistive devices using GMR or TMR. As a specific example, the case where the magnetoresistive devices 12A and 12B are TMR devices will be described below.

The memory cell 12 includes a symmetric pair of magnetoresistive devices 12A and 12B mounted on a substrate 10. The magnetoresistive devices 12A and 12B each have a laminate in which a first magnetic layer 1, a non-magnetic layer 2 and a second magnetic layer 3 are stacked, and a toroidal magnetic layer 5 which is disposed on one surface of the laminate so that its direction along a laminate surface is its axial direction, and the write lines 6X and 6Y (the first and the second write lines) pass through the toroidal magnetic layer 5. The second magnetic layer 3 and the toroidal magnetic layer 5 are bonded with a non-magnetic conductive layer 4 in between, and are electrically connected to each other. Moreover, a read sensing lead 11 is disposed on the top surface (opposite to the toroidal magnetic layer 5) of the laminate in each of the magnetoresistive devices 12A and 12B so that a current in a perpendicular direction to the laminate surface can flow through the laminate toward the substrate 10.

The first magnetic layer 1 is a ferromagnetic layer of which the magnetization direction is fixed, and the second magnetic layer 3 is a ferromagnetic layer (a magnetic sensitive layer) of which the magnetization direction changes according to an external magnetic field. They are stacked with the non-magnetic layer 2 having a very thin thickness of a few nm (a few tens of Å) in between. In the laminate, when a voltage in a perpendicular direction to the laminate surface is applied between the first magnetic layer 1 and the second magnetic layer 3, for example, electrons of the second magnetic layer 2 pass through the non-magnetic layer 2 to be transferred to the first magnetic layer 1, thereby a tunneling current flows. In other words, the non-magnetic layer 2 in this case is a tunnel barrier layer. The tunneling current changes depending upon a relative angle between the spin of the first magnetic layer 1 and the spin of the second magnetic layer 3 in a boundary portion with the non-magnetic layer 2. In the case where the spin of the first magnetic layer 1 and the spin of the second magnetic layer 3 are parallel to each other, the resistance of the magnetoresistive device 12A (12B) is minimum, and in the case where they are antiparallel to each other, the resistance of the magnetoresistive device 12A (12B) is maximum.

The magnetization of the second magnetic layer 3 changes according to an induced magnetic field by the write word line 6X and the write bit line 6Y. In this case, the magnetization of the second magnetic layer 3 is reversed by the induced magnetic field, thereby a relative angle with the magnetization of the first magnetic layer 1 is reversed. Moreover, a target memory cell 12 is selected by a so-called matrix driving method, so the magnetic properties, dimensions and the like of the second magnetic layer 3 are set so that the magnetization can be reversed only in the case where a current flows through both of the write word line 6X and the write bit line 6Y in the same direction. The above-described structure is a basic structure of the magnetoresistive device 12A (12B).

Figure 7:
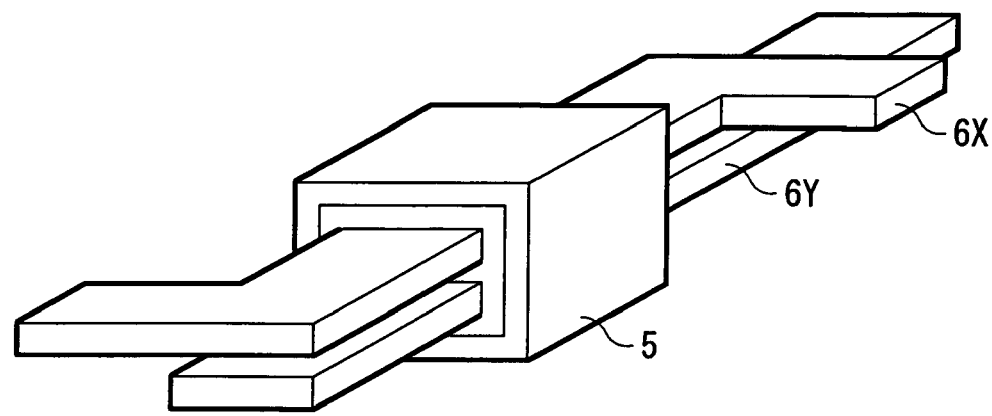
FIG. 7 is an illustration of the structure of a main part in which write lines pass through the memory cell shown in FIG. 6.

The toroidal magnetic layer 5 has a tubular shape having an axis in a perpendicular direction to a paper plane, and includes a portion parallel to the write word line 6X and the write bit line 6Y. FIG. 7 shows a wiring structure of write lines in a region where the magnetoresistive device is disposed. In an intersection region of write lines 6X and 6Y, the write word line 6X is bent, and is disposed vertically parallel to the write bit line 6Y, and the parallel portion is included in the toroidal magnetic layer 5. In other words, the axial direction of the toroidal magnetic layer 5 is in the extending direction of the write word line 6X and the write bit line 6Y, and has a toroidal shape closed in a sectional direction across the axial direction.

Figure 8:
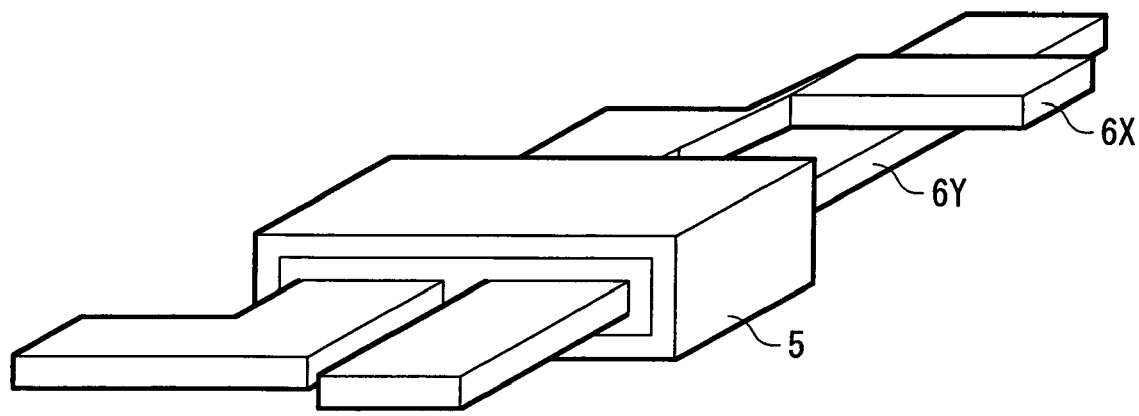
FIG. 8 is an illustration of the structure of a main part according to a modification of the memory cell shown in FIG. 6.

In this case, the magnetization of the second magnetic layer 3 is reversed by a combined magnetic field of the write word line 6X and the write bit line 6Y disposed in parallel to each other; however, the magnitude of the induced magnetic field is larger than that of a combined magnetic field in the case where write lines are intersected. Therefore, the write operation can be efficiently performed. Further, in order to dispose the write lines 6X and 6Y in parallel to each other in the intersection region, in addition to the above-described structure, for example, as shown in FIG. 8, the write lines 6X and 6Y may be disposed laterally parallel to each other.

Moreover, the toroidal magnetic layer 5 is made of a high-permeability magnetic material, and has a function of efficiently changing the magnetization direction of the second magnetic layer 3 through confining a magnetic flux generated by a current through the included write lines 6X and 6Y within the toroidal magnetic layer 5. The toroidal magnetic layer 5 has a closed loop shape in cross section as shown in the drawing, and the generated induced magnetic field is rotated in the toroidal magnetic layer 5 along a plane parallel to the cross section. Thereby, the toroidal magnetic layer 5 has an electromagnetic shielding effect for preventing a leakage magnetic flux to the outside. Moreover, the toroidal magnetic layer 5 is formed so as to be in contact with one surface of the second magnetic layer 3, so a magnetic field is easily transmitted to the magnetic layer 3, and the magnetization direction of the second magnetic layer 3 in close proximity to the toroidal magnetic layer 5 at a high magnetic flux density can be changed more efficiently.

In each of the magnetoresistive devices 12A (12B), a read current flows into the laminate from the read sensing lead 11, and passes from the toroidal magnetic layer 5 to the substrate 10. Therefore, each layer of the laminate except for the non-magnetic layer 2 where a tunneling current flows and the non-magnetic conductive layer 4 and the toroidal magnetic layer 5 are made of a conductive material. For example, a cobalt iron alloy (CoFe) is used for the first magnetic layer 1 and the second magnetic layer 3, and the simple substance of cobalt (Co), a cobalt platinum alloy (CoPt), a nickel iron cobalt alloy (NiFeCo) or the like can be used. Moreover, as the first magnetic layer 1 and the second magnetic layer 3 are stabilized in a state where the magnetization directions thereof are parallel or antiparallel to each other, the easy magnetization axes of the first magnetic layer 1 and the second magnetic layer 3 are preferably disposed parallel to each other.

The thickness of the non-magnetic layer 2 is determined by tunneling resistance and the like. In general, in the magnetic memory device using the TMR device, appropriate tunneling resistance is 10 k$\Omega \cdot (\mu m)^2$ for matching a semiconductor device such as a transistor. However, in order to achieve a higher density and a higher operation speed in the magnetic memory device, the tunneling resistance is preferably 10 k$\Omega \cdot (\mu m)^2$ or less, and more preferably 1 k$\Omega \cdot (\mu m)^2$ or less. In order to achieve such a tunneling resistance value, the thickness of the non-magnetic layer (tunnel barrier layer) 2 is preferably 2 nm or less, and more preferably 1.5 nm or less. However, when the thickness of the non-magnetic layer 2 is too thin, although the tunneling resistance can be reduced, a leakage current due to the roughness of a bonding boundary between the first magnetic layer 1 and the second magnetic layer 3 is generated, thereby a decline in a MR ratio may occur. In order to prevent the decline in the MR ratio, it is necessary for the non-magnetic layer 2 to have as small a thickness as possible without leakage current flowing, and more specifically, the thickness of the non-magnetic layer 2 is preferably 0.3 nm or more.

The non-magnetic conductive layer 4 has a function of antiferromagnetically coupling the second magnetic layer 3 and the toroidal magnetic layer 5, and is made of, for example, ruthenium (Ru), copper (Cu) or the like. Moreover, the toroidal magnetic layer 5 can be made of iron (Fe), a nickel iron alloy (NiFe), Co, CoFe, NiFeCo or the like. In order to concentrate the magnetic field by the write lines 6X and 6Y on the toroidal magnetic layer 5, the permeability of the toroidal magnetic layer 5 is preferably as high as possible, and more specifically 2000 or more, and more preferably 6000 or more.

The write lines 6 are made of aluminum (Al), copper (Cu) or an alloy thereof, and are electrically insulated from each other by an insulating film. The write lines 6 may be made of tungsten (W) and at least one kind selected from the above materials, or may have a structure in which titanium (Ti), titanium nitride (TiN) and aluminum (Al) are stacked in order.

The memory cell 12 stores information considering one of the magnetoresistive devices 12A and 12B as low resistance and the other as high resistance, which will be described in detail in a later description regarding operation. It is because outputs from two magnetoresistive devices 12A and 12B are differentially amplified to be read out. Therefore, it is necessary to manufacture the pair of the magnetoresistive devices 12A and 12B so as to have the same resistance, the same magnetoresistive ratio and the same magnitude of a reversed magnetic field of the second magnetic layer 3.

On the substrate 10 on which the magnetoresistive devices 12A and 12B are formed, an epitaxial layer 9 is formed, and on the epitaxial layer 9, a conductive layer 8 (8A and 8B) and an insulating layer 7 are formed. The conductive layer 8 includes conductive layers 8A and 8B insulated from each other by the insulating layer 7 sandwiched between the conductive layers 8A and 8B. The magnetoresistive devices 12A and 12B are formed on the top surfaces of the conductive layer 8 and the insulating layer 7, and they are positioned so that at least parts of regions where the magnetoresistive devices 12A and 12B are formed are overlapped with regions where the conductive layers 8A and 8B are formed. Therefore, the magnetoresistive devices 12A and 12B are separately bonded to the conductive layers 8A and 8B which are separated and insulated from each other, so that the magnetoresistive devices 12A and 12B are electrically insulated from each other. In other words, in this case, wiring is carried out so that the magnetoresistive devices 12A and 12B are not electrically conducted.

Moreover, in this case, the substrate 10 is an n-type silicon wafer. In general, an impurity, P (phosphorus) is diffused into the n-type silicon wafer, and as the substrate 10, an $n^{++}$-type silicon wafer formed through diffusing a high concentration of P (phosphorus) is used. On the other hand, the epitaxial layer 9 is an $n^-$-type formed through diffusing a low concentration of P (phosphorus). Moreover, the conductive layer 8 is made of metal. At this time, when the epitaxial layer 9 made of the $n^-$-type semiconductor and the conductive layer 8 made of metal are brought into contact with each other, a band gap occurs to form a Schottky diode, that is, a backflow prevention diode 13A or 13B in a readout circuit according to the embodiment.

The backflow prevention diodes 13A and 13B are disposed to prevent a read current from flowing backward through the magnetoresistive devices 12A and 12B from the substrate 10. The magnetoresistive device 12A and the backflow prevention diode 13A, and the magnetoresistive device 12B and the backflow prevention diode 13B are insulated from each other.

[Structure of Readout Circuit]

Figure 9:
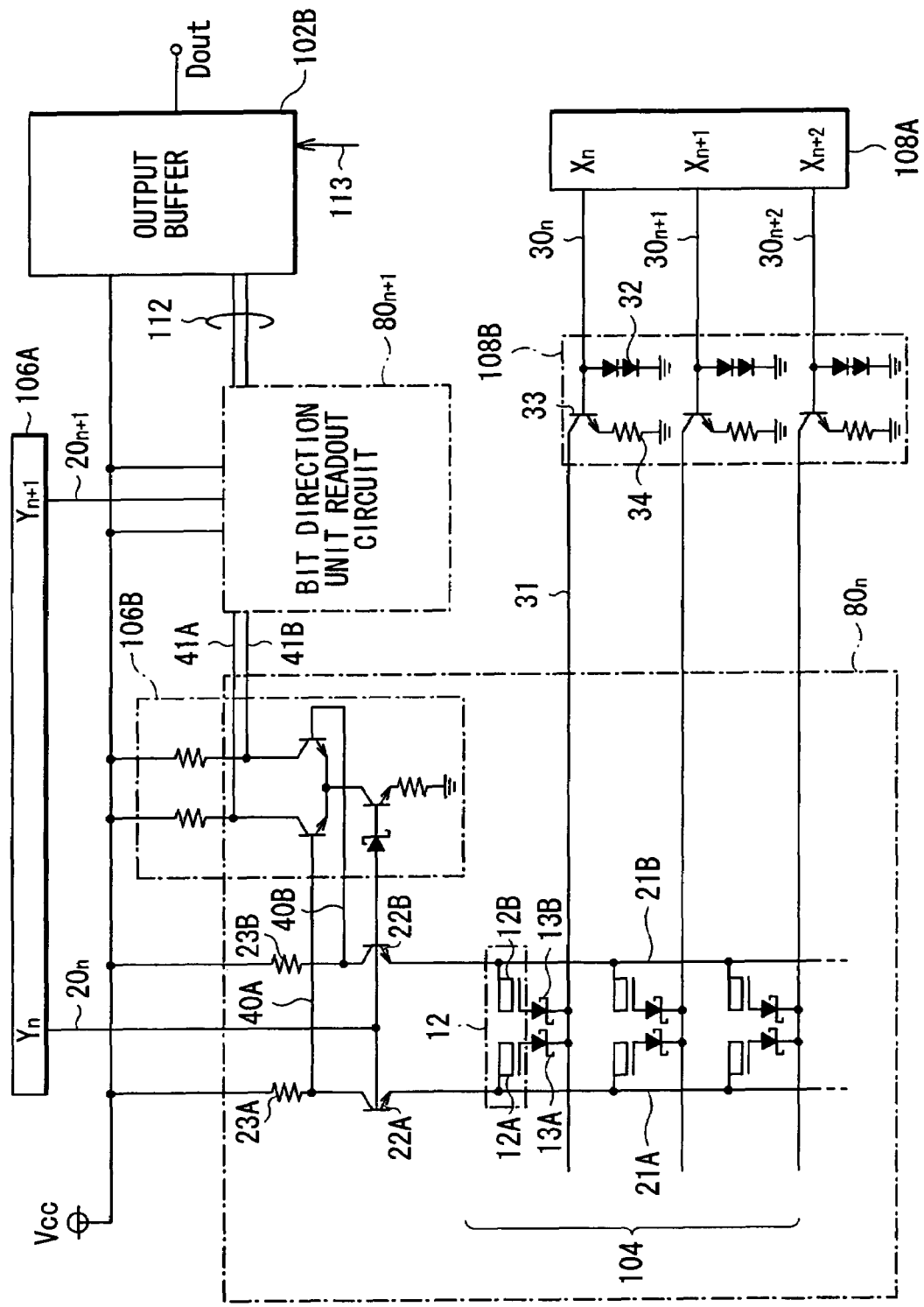
FIG. 9 is a structural view of a read circuit system of the magnetic memory device shown in FIG. 1.

FIG. 9 is a block diagram of a circuit system including a memory cell group and the readout circuit. The read circuit system is a differential amplification type in which the memory cell 12 includes a pair of magnetoresistive devices 12A and 12B. In this case, the information of each memory cell 12 is read out through outputting the differential value of a sensing current flowing into the magnetoresistive devices 12A and 12B (a current flowing into the magnetoresistive devices 12A and 12B from sense bit decode lines 21A and 21B and flowing out to a common sense word decode line 31).

In the drawing, the memory cells 12 in each bit array Yn of the memory cell group 104 and a part of the readout circuit including the sense amplifier 106B constitute a bit direction unit readout circuit 80 ( . . . , 80n, 80n+1, . . . ) which is a repeating unit of the readout circuit, and are aligned in parallel to a bit array direction. In each bit direction unit readout circuit 80, the sense bit decode lines 21A and 21B are connected to a Y-direction address decoder 106A through the bit decode line 20 ( . . . , 20n, 20n+1, . . . ), and the sense amplifier 106B is connected to an output buffer 102B through a read data bus 112. In the drawing, all bit direction unit readout circuits 80 are not shown because of a lack of space, so only two arrays are shown. Further, as in the case of the bit direction unit readout circuits 80, only two arrays Yn and Yn+1 of the memory cell group 104 are shown.

In the memory cell group 104, wiring is carried out in a matrix form with a sense word decode line 31 (hereinafter referred to as a sense word line) aligned in an X direction and a pair of sense bit decode lines 21A and 21B (hereinafter referred to as sense bit lines) aligned in a Y direction. Each memory cell 12 is disposed in a position where the sense word line 31 and the sense bit lines 12A and 21B intersect, and the memory cells 12 which are connected in series by the common sense bit lines 21A and 21B forms a bit array Yn, and the memory cells 12 which are cascaded by the common sense word line 31 forms a word array Xn. In one memory cell 12, an end of each of the magnetoresistive devices 12A and 12B is connected to the sense bit lines 21A and 21B through the read sensing lead 11 (refer to FIG. 6), and the other end is connected to the common sense word line 31 through the backflow prevention diodes 13A and 13B.

Current-voltage conversion resistors 23A and 23B (hereinafter referred to as resistors 23A and 23B) and the collector-emitters of the transistors 22A and 22B are connected in series to ends of the sense bit lines 21A and 21B (on a side closer to the power source Vcc), respectively. The bases of the transistors 22A and 22B are connected to the bit decode line 20, and have a switching function of opening and closing according to the value of a selection signal (bit decode value) inputted from the bit decode line 20.

Moreover, sense amplifier input lines 40A and 40B (hereinafter referred to as input lines 40A and 40B) are drawn from connecting points at ends of the resistors 23A and 23B connected to the sense bit lines 21A and 21B on a side opposite to the power source Vcc. In this case, the resistors 23A and 23B functions as bias resistors of the sense amplifier 106B. One sense amplifier 106B is disposed in each bit direction unit readout circuit 80, and the sense amplifier functions as a differential amplifier which takes a potential difference between one pair of the sense bit lines 21A and 21B to amplify the potential difference. Each sense amplifier 106B is connected to corresponding sense bit lines 21A and 21B by the input lines 40A and 40B, and all sense amplifiers 106B are cascaded by common sense amplifier output lines 41A and 41B (hereinafter referred to output lines 41A and 41B), and are finally connected to an output buffer 102B by the read data bus 112. In addition, in the transistors 22A and 22B, the resistor 23A and 23B, and the sense amplifier 106B, it is necessary for paired devices to have identical characteristics.

The memory cells 12 aligned in the same word array Xn (X1, X2, . . . ) are connected to each sense word line 31 (in this case, the backflow prevention diodes 13A and 13B are disposed between the memory cell 12 and the sense word line 31). Moreover, the collector-emitter of a transistor 33 and a current limiting resistor 34 are connected in series on the ground side of the sense word line 31. The base terminal of the transistor 33 is connected to the word decode line 30 ( . . . , 30n, 30n+1, . . . ), and the transistor 33 functions as a switch for opening and closing according to the value of a selection signal (bit decode value) inputted from the X-direction address decoder 108A to the base of the transistor 33.

Moreover, in this case, the diode 32, the transistor 33 and the current limiting resistor 34 constitute the constant current circuit 108B. The constant current circuit 108B has a function of making a current flowing through the sense word line 31 constant. In this case, the diode 32 includes two diodes connected in series.

Next, operations of a magnetic memory device with the above structure will be described below.

[Write Operation to Memory Cell]

At first, the information storage system in the memory cell 12 will be described below.

Figure 10:
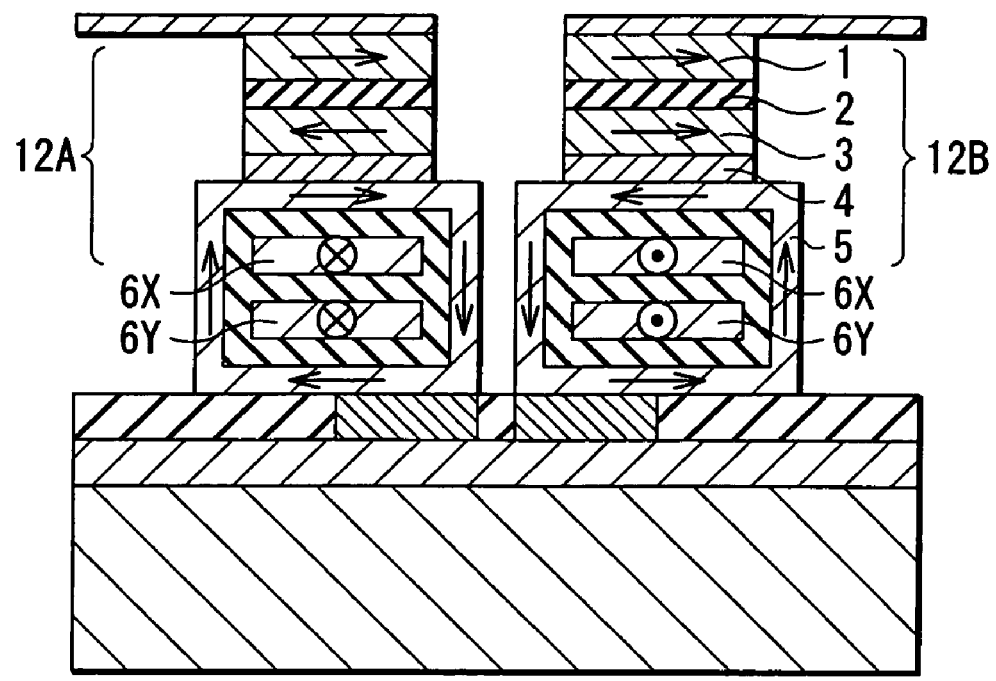
FIG. 10 is an illustration showing a memory state written into the memory cell shown in FIG. 6.
Figure 11:
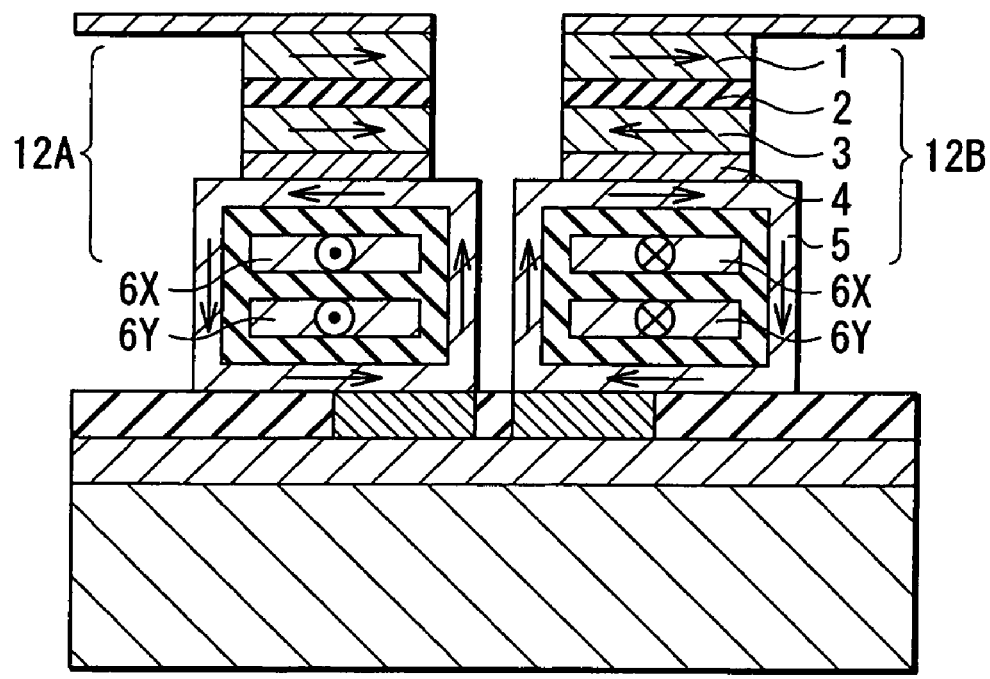
FIG. 11 is an illustration showing another memory state written into the memory cell shown in FIG. 6.

In the memory cell 12, while the magnetization of the first magnetic layers 1 in the pair of magnetoresistive devices 12A and 12B (refer to FIG. 6) is fixed in a rightward direction, the second magnetic layers 3 in the magnetoresistive devices 12A and 12B are magnetized in a direction antiparallel to each other. Therefore, in the magnetoresistive devices 12A and 12B, the combination of the magnetization directions of each first magnetic layer 1 and each second magnetic layer 3 is always (antiparallel, parallel) or (parallel, antiparallel). FIGS. 10 and 11 show the states of the combination. In this case, each state corresponds to binary information "0" or "1", and the memory cell 12 is brought into either state, thereby 1 bit of information is stored in one memory cell 12. Moreover, when the magnetization directions of the first magnetic layer 1 and the second magnetic layer 3 are parallel, the magnetoresistive device 12A (12B) is brought into a low resistance state in which a large tunneling current flows, and when they are antiparallel, the magnetoresistive device 12A (12B) is brought into a high resistance state in which a small tunneling current flows. In other words, either of the pair of the magnetoresistive devices 12A and 12B is always brought into a low resistance state, and the other is always brought into a high resistance state, thereby information is stored.

These two storage states are written when the magnetization directions of the second magnetic layers 3 of the magnetoresistive devices 12A and 12B are antiparallel to each other. In order to make the magnetization directions antiparallel to each other, currents flow in relatively opposite directions through the write lines 6X and 6Y in the magnetoresistive devices 12A and 12B.

Figure 12:
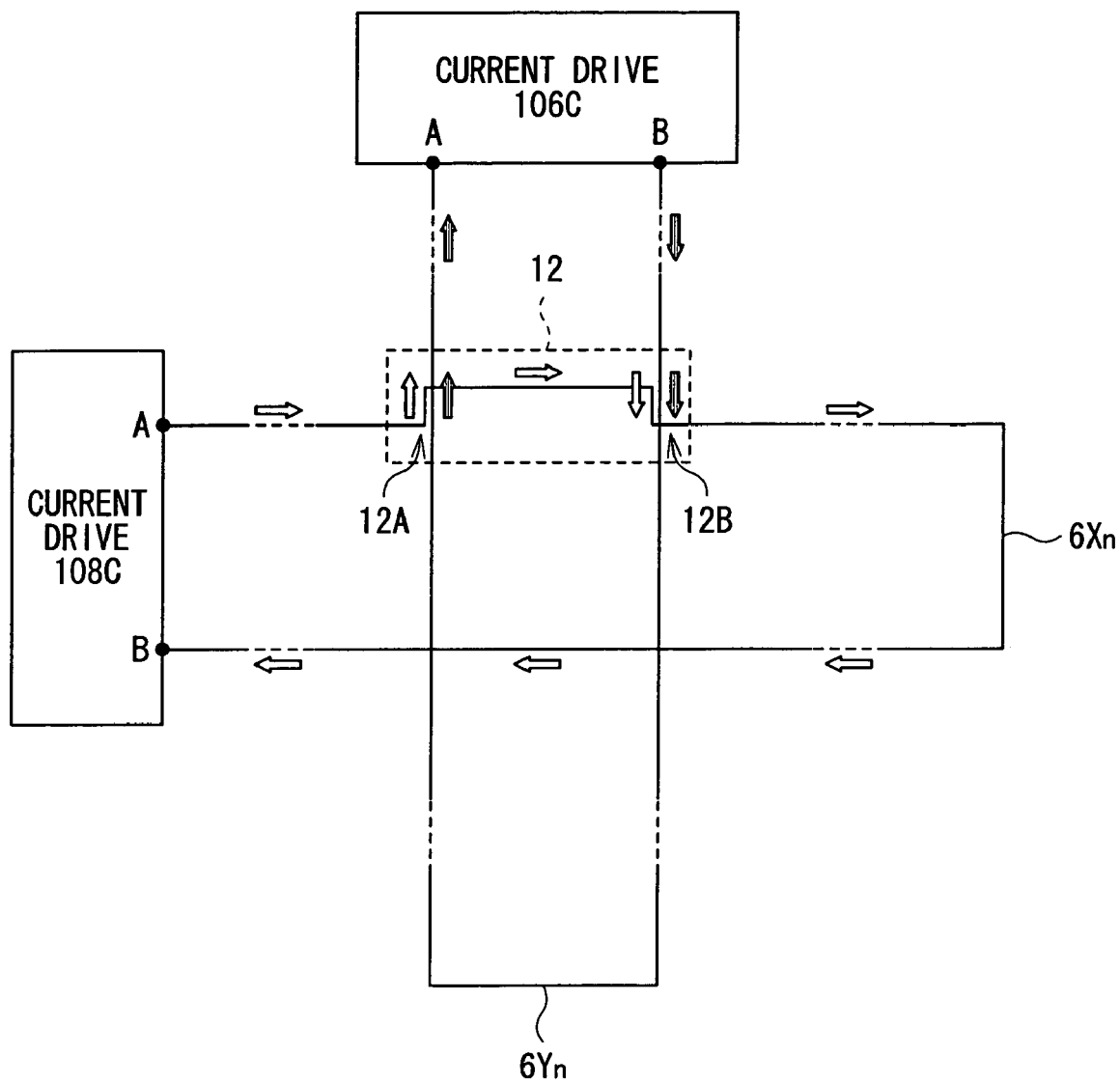
FIG. 12 is an illustration for describing a write operation corresponding to the memory state shown in FIG. 10.

For example, in order to write the storage state shown in FIG. 10 to the memory cell 12 in the bit array Yn and the word array Xn, a write current may flow as shown in FIG. 12. Thus, when a current flows through the write word line 6Xn in a direction from a drive point A to a drive point B from the current drive 108C, and a current flows through the write bit line 6Yn in a direction from a drive point B to a drive point A from the current drive 106C, write currents flow in the same direction in a region where the magnetoresistive devices 12A and 12B are disposed because of the bent write word line 6Xn and in relatively opposite directions in the magnetoresistive devices 12A and 12B.

Magnetic fields rotated in opposite directions in the toroidal magnetic layers 5 of the magnetoresistive devices 12A and 12B are induced by the write currents, and the magnetizations (that is, the directions of the induced magnetic fields) in surfaces of the toroidal magnetic layers 5 facing the second magnetic layers 4 are antiparallel to each other. The magnetizations of the second magnetic layers 3 in the magnetoresistive devices 12A and 12B are antiparallel to each other according to the directions of the magnetic fields applied from outside, and the magnetization states of the second magnetic layers 3 are fixed by antiferromagnetic coupling to the toroidal magnetic layer 5. In this case, the magnetoresistive device 12A is in a high resistance state, and the magnetoresistive device 12B is in a low resistance state.

Figure 13:
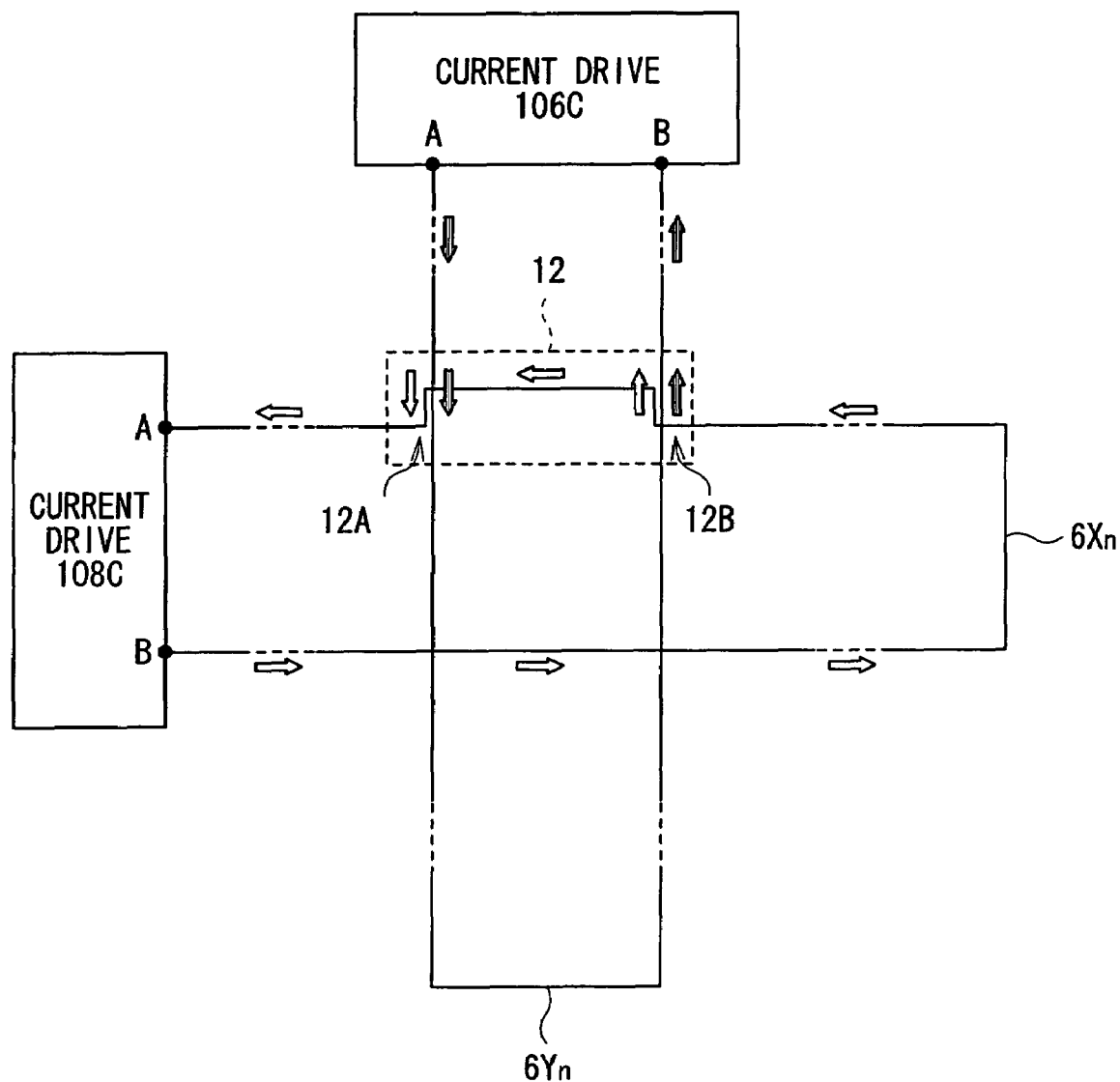
FIG. 13 is an illustration for describing a write operation corresponding to the memory state shown in FIG. 11.

In order to write the storage state shown in FIG. 11, as shown in FIG. 13, currents may flow through the magnetoresistive devices 12A and 12B in opposite directions to those in the above case. The memory cell 12 operates so that the magnetoresistive devices 12A and 12B change places with those in the above case, thereby a write operation is performed.

In this case, the induced magnetic field is confined in the toroidal magnetic layer 5, so an effective magnetic field strength contributing to the reversal of the magnetization of the second magnetic layer increases, compared to that in the related art. As a result, the reversal of the magnetization direction of the second magnetic layer 3 can be performed with a sufficient magnetic field strength, and the magnetization can be aligned in a predetermined direction so as to become sufficiently large. Thereby, the write operation can be efficiently performed. At the same time, as the induced magnetic field is not leaked to the outside of a target device 12A (12B), the possibility that the magnetization direction of the second magnetic layer 3 is disturbed by an external disturbance magnetic field is reduced in an adjacent memory cell 12, and written information can be prevented from being erased or rewritten unexpectedly. Therefore, information can be reliably written.

Next, a method of writing information on the basis of such a storage system will be described below.

In the magnetic memory device, at first, the address buffer 101 takes the voltage of a selection signal inputted into the external data terminals A0 through A20 to amplify the voltage in an internal buffer, and the voltage is transmitted to the X-direction and Y-direction address decoders 108A and 106A through the address lines 105 and 107 (refer to FIG. 1). At the same time, the data buffer 102 takes the voltage of a data signal inputted into the external data terminals D0 through D7 to amplify the voltage in an internal buffer, and the voltage is transmitted to X-direction and Y-direction current drives 108C and 106C through the write data buses 110 and 111.

On the other hand, a power save signal is outputted from the control logic portion 103 (refer to FIG. 1) to the first and the second constant current circuits. In other words, when the power save signal in a "Low" state is inputted into the constant current circuit control terminal 91 (refer to FIG. 5) in the current drives 108C and 106C, the first and the second constant current circuits (the transistor Q8 and the resistor R4, and the transistor Q7 and the resistor R3) and the whole write circuit system are brought into an inactive state. On the other hand, when the power save signal in a "High" state is inputted, the constant current circuits are brought into an active state in which the constant current circuits can be activated immediately, and the constant current circuits stand by to conduct to the transistors Q8 and Q7 through either of the circuit selector switches SW1 and SW2.

The address decoders 108A and 106A send out a decode value corresponding to the selection signal to corresponding word decode lines 16X and 16Y (refer to FIG. 5). For example, the decode value is sent out to the nth word decode line 16Xn and the nth bit decode line 16Yn. Thereby, in the current drives 108C and 106C to which the signal is inputted, the circuit selector switches SW1 and SW2 are turned on, and are selected as targets to be driven.

Moreover, a data signal from the data buffer 102 is inputted into the data signal lines 14 of the current drives 108C and 106C, and a signal produced through inverting the data signal is inputted into the reference signal line 15. Thereby, the current drives 108C and 106C determine the directions of currents flowing through the write word line 6X and the write bit line 6Y according to binary information to be written.

(Operation of Current Drive)

The specific operation of the write circuit system will be described referring to the storage state exemplified in FIGS. 10 and 12. FIGS. 14A through 14F show timing charts in a selected current drive 108C (during the operation, the transistors Q7 and Q8 are always in conduction, so they are not shown). Although the following operation steps take place virtually simultaneously, the description is given step by step, so it is assumed that extremely short times Δt1 and Δt2 elapse in each step. Moreover, FIG. 15 shows the current drive 108C corresponding to the nth word array selected as a target to be driven, and the switching state of each transistor in the current drive 108C.

In the current drive 108C, a data signal "Low" is inputted into the data signal line 14, and a reference signal "High" which is an inversion signal of the data signal "Low" is inputted into the reference signal line 15. Thereby, at first, a voltage level "Low" (refer to FIG. 14A) is applied to the base terminal of the transistor Q3, and a voltage level "High" (refer to FIG. 14B) is applied to the base terminal of the transistor Q4, and then the transistor Q3 is brought into an off state, and the transistor Q4 is brought into an on state.

When the transistor Q4 is brought into an on state, in the transistor Q6, a base voltage declines (refer to FIG. 14D) to become equivalent to the potential of the emitter terminal. Thereby, the transistor Q6 is brought into an off state. On the other hand, as the transistor Q3 is in an off state, in the transistor Q5, the base terminal applies a relatively high voltage to the emitter terminal (refer to FIG. 14C). Thereby, the transistor Q5 is brought into an on state.

Moreover, as the transistor Q5 is brought into an on state, the base voltage of the transistor Q2 declines (refer to FIG. 14F), and as the transistor Q6 is in an off state, the base voltage of the transistor Q1 is relatively higher (refer to FIG. 14E). Thereby, the transistor Q1 is brought into an on state in which a larger amount of a current flows, and the transistor Q2 is brought into an off state in which only a small amount of a current flows. In other words, in reality, by an effect of the on/off state of the transistors Q5 and Q6 on the voltage level of the base terminal, the transistor Q1 operates so that a large amount of a current flows through the transistor Q1, and the transistor Q2 operates so that a small amount of a current flows through the transistor Q2.

Thus, by the input of the data signal and the reference signal, at first, the transistors Q3 and Q4 of the second differential switch pair operate, and according to the operation states of the transistors Q3 and Q4, the differential operations of the transistors Q5 and Q6 of the third differential switch pair and the differential operations of the transistors Q1 and Q2 of the first differential switch pair are performed one after another, thereby the on/off state of the first differential switch pair (Q1 and Q2) and the on/off state of the second differential switch pairs (Q3 and Q4) are complementary to each other. Further, the on/off states are selected according to the data signal value.

By the series of operations of the transistors Q1 through Q6, a current from the power source Vcc flows through the transistor Q1 which is in an on state out of the transistors Q1 and Q2 into the drive point A. As the transistor Q3 is in an off state, the current flows through the write word line 6Xn from the drive point A, and then flows out from the drive point B to the ground through the transistor Q4 which is in an on state.

In other words, in the first differential switch pair, the transistor Q1 is in an on state, and the transistor Q2 is in an off state, so the drive point A is selected as a current inflow side in the write word line 6Xn. On the other hand, in the second differential switch pair which is complementary to the first differential switch pair, the transistor Q3 is in an off state and the transistor Q4 is in an on state, so the drive point B on the opposite side is selected as a current outflow side in the write word line 6Xn. Thus, a write current in a direction from the drive point A to the drive point B is applied from the current drive 108C to the write word line 6Xn.

Moreover, as is evident from the above operations, a write current path including the first and the second differential switch pairs (Q1 through Q4) and the write word line 6Xn and the path of a current flowing through the third differential switch pair (Q5 and Q6) are independent of each other. Further, the write current path is grounded through the circuit selector switch SW1, the transistor Q8 and the resistor R4, and the path of a current flowing through the third differential switch pair is grounded through the circuit selector switch SW2, the transistor Q7 and the resistor R3.

In this case, the magnitude I of the write current flowing through the path including the transistor Q8 and the resistor R4 is determined by the following formula, where the resistance of the resistor R4 is Rc.

$$I(A)=(Vb-\phi')(\text{Volt})/Rc(\Omega)$$

In the formula, Vb is a voltage level inputted into the base terminal of the transistor Q8, and $\phi'$ is a forward voltage between the base and the emitter of the transistor Q8. They are fixed value, so it is obvious that when the resistance Rc is determined, the flowing current becomes a constant value, and the current value can be uniquely determined by the resistance Rc as a parameter. Thus, the transistor Q8 functions not only as a switch but also as a constant current circuit which directly controls a current together with the resistor R4.

Thereby, the value of the write current is fixed on the path where the write current flows out from the write word line 6Xn, so a constant write current always flows through the write word line 6Xn.

In the current drive 108C according to the embodiment, a current flowing through the write word line 6X is always controlled to a constant value, so when the resistance of the write word line 6X changes, a potential difference between the drive point A and the drive point B changes according to the change in the resistance of the write word line 6X. When the current drive 108C is driven as in the case of the example, the larger the resistance of the write word line 6X is, the higher the potential of the drive point A and the lower the potential of the drive point B become, so the current drive 108C attempts to keep the current amount flowing through the write word line 6X constant. At this time, the potential of the drive point A is close to the power source voltage, because the transistor Q1 is on, and the transistor Q3 is off, and the potential of the drive point B is close to the emitter potential of the transistor Q4, because the transistor Q2 is off and the transistor Q4 is on. In other words, once the data signal and the reference signal are inputted, and the emitter potentials of the transistors Q3 and Q4 are determined, each potential of the drive points A and B has a value determined between the power source voltage and the emitter potential according to the operations of the transistors Q1 through Q6 irrespective of the input signal voltages of the data signal, the reference signal and the like. Therefore, the potential difference between the drive points A and B can vary widely.

Such potential variations have an influence on the base voltages of the transistors Q5 and Q6 at the same time. A larger amount of a current flows through the transistor Q5, and a smaller amount of a current flows through the transistor Q6, so the opening/closing balance in the differential pair is biased more largely. As a result, the transistor Q2 can keep an off state, even if the base potential declines, and the potential on the emitter connected to the drive point B declines. Likewise, the transistor Q1 can keep an on state, even if the base potential increases, and the potential on the emitter connected to the drive point A increases. Thus, even if the potential difference between the drive points A and B (the resistance of the write word line 6X) varies, the third differential switch pair (Q5 and Q6) acts as a differential amplifier to automatically make a fine adjustment to the operation state of the first differential switch pair (Q1 and Q2) according to the potential variations. Therefore, the opening/closing balance in the first through third differential switch pairs (Q1 through Q6) can be appropriately kept, and compensation for the above-described wide potential variations between the drive points A and B is provided.

Thus, the current drive 108C performs current direction control for selecting an end as a current inflow side and the other end as a current outflow side in the write word line 6Xn having both ends drawn into the drive points A and B, as well as constant current control so as to stably supply a constant current in a direction from the drive point A to the drive point B. The same holds true for each of the current drives 108C and 106C on the write lines 6X and 6Y.

On the other hand, in the current drive 106C selected in this case, a current flows through the write bit line 6Yn in a direction from the drive point B to the drive point A. To do so, a data signal "High" may be inputted into the data signal line 14 and a reference signal "Low" may be inputted into the reference signal line 15. Thereby, the first through the third differential switch pairs (the transistors Q1 through Q6) are switched contrary to the case of the above current drive 108C, and the write current flows into the drive point B from the transistor Q2, flows out from the drive point A through the write word line 6Yn, and then flows into the transistor Q3.

Thus, the current drives 108C and 106C supply write currents in the directions shown in FIG. 12 to the write word line 6Xn and the write bit line 6Yn. Thereby, the memory cell 12 in the bit array Yn and the word array Xn is selected, and bit data represented in the state in FIG. 10 is written to the memory cell 12 according to the directions of the supplied write currents. The write currents at this time are always a predetermined value, so the write operation is stably performed.

As shown in FIG. 13, another storage state of the memory cell shown in FIG. 11 is written through supplying write currents in the magnetoresistive devices 12A and 12B in directions opposite to those in FIG. 12. In other words, the current drive 108C supplies a current to the write word line 6Xn in a direction from the drive point B to the drive point A, and the current drive 106C supplies a current to the write bit line 6Yn in a direction from the drive point A to the drive point B.

For this purpose, a data signal "High" may be inputted into the data signal line 14 of the current drive 108C, and a reference signal "Low" may be inputted into the reference signal line 15. Thereby, the transistors Q1 through Q6 of the current drive 108C are switched contrary to the above-described case, and a write current flows from the transistor Q2 to the transistor Q3 through the write word line 6Xn. In contrast to the current drive 108C at this time, the current drive 106C is driven through inputting a data signal "Low" into the data signal line 14 and inputting a reference signal "High" into the reference signal line 15. Thereby, in the memory cell 12, the magnetization directions of the second magnetic layers 3 of the magnetoresistive devices 12A and 12B are antiparallel so as to face each other.

[Read Operation]

In the magnetic memory device, information written to the memory cell 12 is read out through the following steps (refer to FIG. 9).

Each memory cell 12 is in a state where information is stored through bringing the magnetoresistive devices 12A and 12B into either of two antiparallel magnetization states. The memory cell 12 from which the information is to be read out is selected through inputting a selection signal into the bit decode line 20 in a Y direction and the word decode line 30 in an X direction corresponding to the address of the memory cell 12. For example, when the selected memory cell 12 is in a Yn array and an Xn array, a signal is inputted into the Ynth bit decode line 20n and the Xnth word decode line 30n.

When the voltage level in the bit decode line 20n is "High", the transistors 22A and 22B are brought into conduction, and a sensing current flows through the Ynth array direction block (bit array Yn) of the memory cells 12. The sensing current flows through the sense bit lines 21A and 21B from the side closer to the power source Vcc to the opposite side. On the other hand, when the voltage level in the word decode line 30n is "High", the transistor 33 is brought into conduction, thereby a current is allowed to flow through the Xnth array direction block (word array Xn) of the memory cells 12.

Therefore, the sensing current flows from the Ynth sense bit line 21A to the Xnth sense word line 31 through the magnetoresistive device 12A and the diode 13A and from the Ynth sense bit line 21B to the Xnth sense word line 31 through the magnetoresistive device 12B and the diode 13B, and the sensing current flows to the ground through the collector-emitter of the transistor 33 of the constant current circuit 108B.

Information is read out through detecting a difference between current values flowing through the magnetoresistive devices 12A and 12B in the memory cell 12. The currents flowing through them are approximately equal to the sensing currents flowing through the sense bit lines 21A and 21B, and the values of the sensing currents can be detected through converting the sensing currents into voltages by voltage drops in the resistors 23A and 23B connected to the sense bit lines 21A and 21B in series. Therefore, in this case, voltage drops of the resistor 23A and resistor 23B are taken out of the input lines 40A and 40B as read signals, respectively, and then a difference between the read signals is detected. Thus, a difference between the output values is taken out through the use of two magnetoresistive devices 12A and 12B, thereby the memory cell 12 can obtain a large output value from which noises are removed.

Moreover, differential amplification of the potential difference taken out of the input lines 40A and 40B is performed by the sense amplifier 106B to obtain a larger output with a good S/N ratio. The sense amplifiers 106B of the bit direction unit readout circuits 80 ( . . . , 80n, 80n+1, . . . ) are cascaded by the output lines 41A and 41B, and a corresponding sense amplifier 106B becomes active concurrently with the selection of the bit decode line 20, and only a collector output is transmitted to the output lines 41A and 41B.

The output of the sense amplifier 106B is finally inputted into the output buffer 102B through the output lines 41A and 41B and the read data bus 112. The output buffer 102B amplifies an inputted signal voltage, and outputs the signal voltage as a binary voltage signal to the external data terminals D0 through D7.

In the read operation, the magnitude of the sensing current for the selected memory cell 12 is limited within a constant range by the constant current circuit 108B. In other words, a current flowing through the sense word line 31, the total of currents flowing the sense bit lines 21A and 21B, or the total of currents flowing through the magnetoresistive devices 12A and 12B is set to a value within a constant range. Thereby, the current value of each of the sense bit lines 21A and 21B is a distributed value of the current amount standardized to be constant according to a resistance ratio between the magnetoresistive devices 12A and 12B. Therefore, even if the resistances of the magnetoresistive devices 12A and 12B vary, the fluctuations of the current in each of the sense bit lines 21A and 21B are always limited within a certain range according to the total current value, thereby a stable differential output can be obtained.

Moreover, the diodes 13A and 13B disposed on current paths of the magnetoresistive devices 12A and 12B prevent currents from flowing back from the sense word line 31 to the magnetoresistive devices 12A and 12B. Therefore, a path where a sneak current component flowing back through the magnetoresistive device 12A (12B) occurs is blocked to contribute to an improvement in the S/N ratio of the read signal.

Thus, in the embodiment, the current drives 108C and 106C have a structure in which both ends of the write lines 6X and 6Y are drawn into the drive points A and B, and on the loop, (1) a current flows by switching the direction of the current according to the data signal, and (2) the current amount is controlled to provide a constant current after flowing out of the write line 6, so a current with a constant magnitude can be supplied to the write lines 6X and 6Y in both directions irrespective of variations in resistance. Therefore, in the magnetic memory device, information is always written to each memory cell 12 through the use of a constant current, so the information is reliably written by an induced magnetic field with a sufficient strength, and a leakage magnetic field to adjacent memory cells 12 is limited within a setting range under good control, thereby a stable write operation can be performed. Further, it is expected that as the write lines 6 become finer according to higher levels of integration of memory cells, wider resistance variations in manufacturing will occur, so in future, an influence of resistance variations on the write current tends to be more obvious. The current drives 108C and 106C can be applied to such a case, and can exert their effects more favorably.

The current drives 108C and 106C control the current direction by the operations of the differential pairs including the transistors Q1 through Q6, so the direction of the write current is controlled by a different system from a system in a related art. In particular, in this case, the transistors Q5 and Q6 are disposed, and they act as differential amplifiers to control the switching states of the transistors Q1 and Q2, so the transistors Q1 and Q2 perform the switching operation with a strength well following a potential difference between the drive points A and B. Moreover, the transistors Q1 and Q2 follow wide potential variations between the drive points A and B by the transistors Q5 and Q6, so even if the resistance values of the write lines 6 widely vary, while the current amount through the write lines 6 can be kept constant, the balance of the switching operation for the current direction control can be kept.

Moreover, the current drive 108C and the current drive 106C mainly include the transistors Q1 through Q8 and the resistors R1 through R4 only, so a write current supply system can be formed with extremely simple structure, compared to that in a related art. Therefore, the current drives 108C and 106C do not need a large circuit space, even if the current drives 108C and 106C are disposed for each word array Xn and each bit array Yn.

Further, a path of a current flowing from the power source (Vcc) to the ground is formed in the current drives 108C and 106C which are subjected to the write operation only during the write operation, so unnecessary power consumption in a portion except for a circuit portion performing the write operation can be reduced.

In particular, the constant current circuit is shared among a plurality of current direction control portions 54, so compared to the case where the constant current circuit is independently disposed for each current direction control circuit 54, the number of circuit components can be reduced. Accordingly, unnecessary power consumption in the constant current circuit can be reduced. Further, as the same constant current circuit is shared among the current direction control portions 54, variations in characteristics can be prevented, and the total amount of currents flowing through the current drives 108C and 106C becomes constant. Therefore, variations in the write current flowing through each write line 6 can be prevented to make the write current constant.

Moreover, in particular, in the case where one constant current circuit is disposed for a large number of write lines 6, the constant current circuit control terminal 91 is connected to the base terminals of the transistors Q8 and Q7 constituting the constant current circuit to input a power save signal into the transistors Q8 and Q7, so by the switching operation of the transistors Q8 and Q7, each write line circuit can be controlled to be in an active state in which each write circuit can operate or in an inactive state. In this case, in the inactive state, a current can be prevented from flowing through all current drive circuits sharing the use of the constant current circuit, so it contributes to a reduction in power consumption.

As described above, in the embodiment, the number of write circuit components, variations in the write current flowing through each write line 6 and the power consumption for the write operation can be reduced.

[Modifications]

Modifications of the above-described embodiment, mainly modifications of the current drive will be described below.

(Modification 1)

Figure 16:
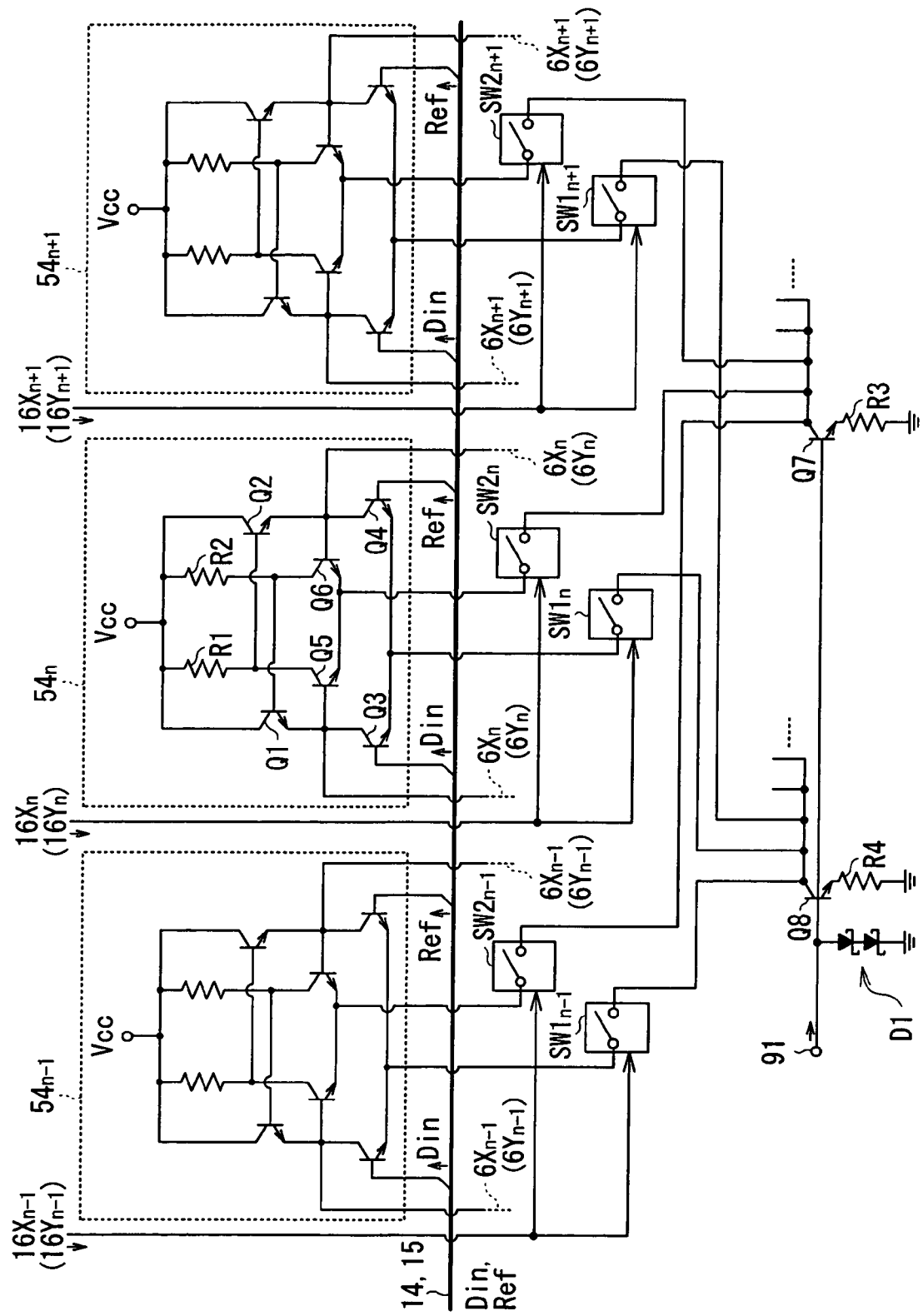
FIG. 16 is a structural view of a first modification of the current drive shown in FIG. 5.

FIG. 16 shows a first modification of the structure of the current drive. In the current drive according to Modification 1, a constant voltage device using a band gap reference is added to the constant current circuit (the transistor Q8 and the resistor R4) in the structure of each of the current drives 108C and 106C shown in FIG. 5. More specifically, as the constant voltage device, a diode D1 is disposed between the base of the transistor Q8 and the ground. The diode D1 includes, for example, two diodes connected in series as shown in the drawing, and the diode D1 has a function of making the base voltage of the transistor Q8 constant at the time of inputting a control signal (power save signal) from the constant current circuit control terminal 91 through the use of the band gap reference.

In the case where the signal value inputted into the base of the transistor Q8 is constant, such a constant voltage device is unnecessary; however, in the case where the stability of the inputted signal value is not ensured, when the constant voltage device using a band gap reference such as the diode D1 is added, the base voltage of the transistor Q8 can be actively fixed, and the constant current control between the collector and the emitter of the transistor Q8 can be reinforced.

(Modification 2)

Figure 17:
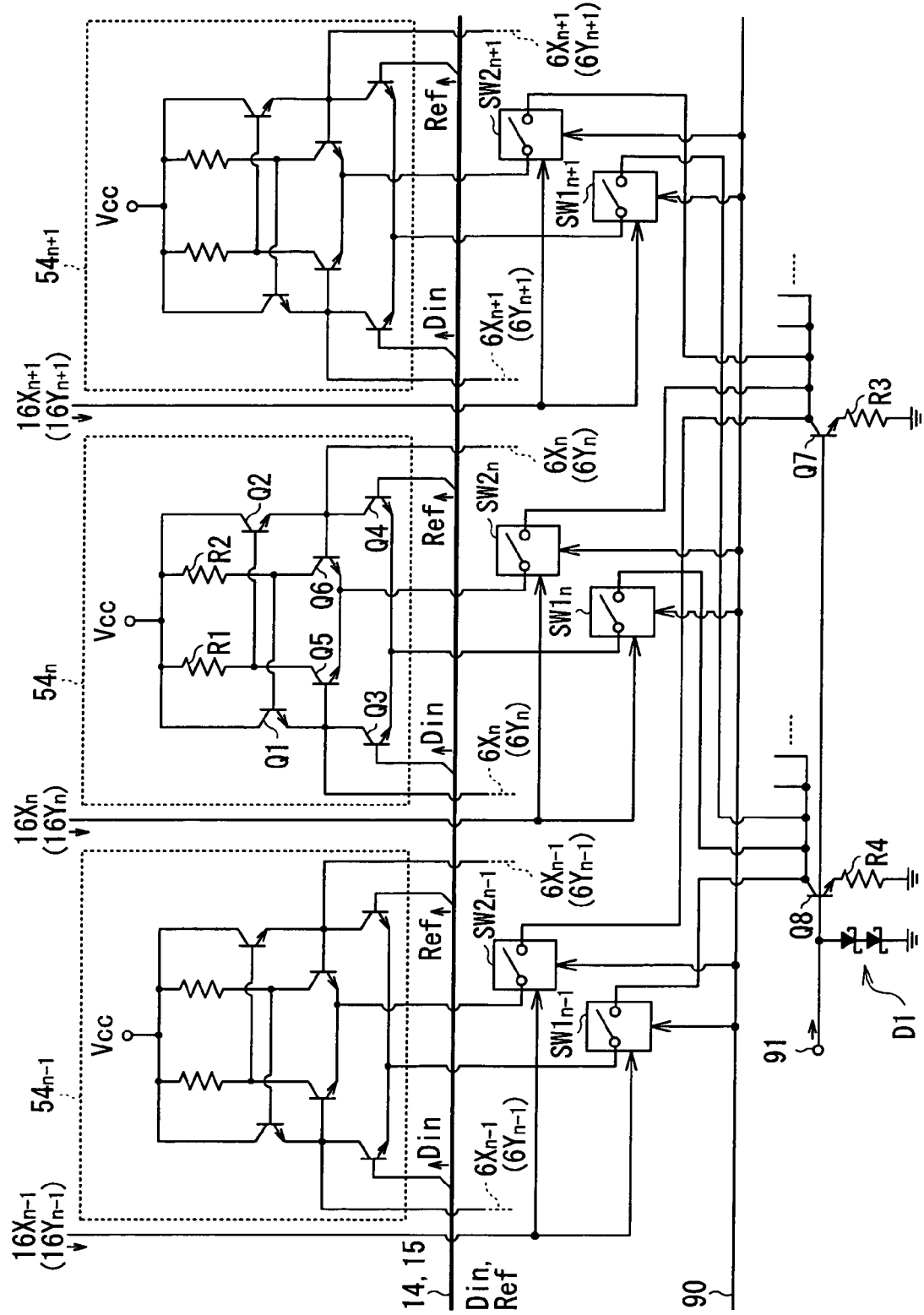
FIG. 17 is a structural view of a second modification of the current drive shown in FIG. 5.

FIG. 17 shows a second modification of the structure of the current drive. In the current drive according to Modification 2, a write selection signal line 90 is added to the structure of the current drive according to Modification 1 shown in FIG. 16. The write selection signal line 90 is connected to the circuit selector switches SW1 and SW2. A write selection signal indicating a write mode is transmitted into the circuit selector switches SW1 and SW2 through the write selection signal line 90.

In other words, in the current drive according to Modification 2, the switching operations of the circuit selector switches SW1 and SW2 are controlled according to a circuit selection signal (decode signal) from the word decode line 16X (bit decode line 16Y) and a write selection signal from the write selection signal line 90. The write selection signal line 90 is connected to the control logic portion 103 (refer to FIG. 1), and the write selection signal is transmitted from the control logic portion 103. The control logic portion 103 transmits a signal of the logical sum of a chip select signal (CS) which controls whether or not to make the magnetic memory device active and a write enable signal (WE) for switching between the read operation and the write operation as a write selection signal.

Thus, in the modification, the switching operations of the circuit selector switches SW1 and SW2 are controlled according to two signals, that is, the circuit selection signal and the write selection signal. FIG. 18 shows an example of the structure of a switch for controlling the switching operation according to such two signals. FIG. 19 shows the operation states of the switch according to input signals. The structure of the first circuit selector switch SW1 will be described as a basis below; however, the second circuit selector switch SW2 has the same structure as that of the first circuit selector switch SW1.

The switch includes a transistor 461 in which the write selection signal line 90 is connected to the base terminal thereof, and a transistor 462 in which the word decode line 16X (bit decode line 16Y) is connected to the base terminal thereof. The collector-emitter of the transistor 462 is connected between the emitter terminals of the transistors Q3 and Q4 in the current direction control portion 54 and the transistor Q8 in the constant current circuit. Moreover, the collector terminal of the transistor 461 is connected to the power source (Vcc), and the emitter terminal of the transistor 461 is connected to the emitter side of the transistor 462.

In the switch, it is necessary that a voltage value V1 (voltage value of the write selection signal) in the case where the input voltage of the base of the transistor 461 is "High" and a voltage value V2 (voltage value of the circuit selection signal) in the case where the input voltage of the base of the transistor 462 is "High" are set to have a relationship of V1−V2>0.3 (Volt). The voltage values are adjusted before the stage of the switch, and for the sake of simplification, detailed description will not be given.

In the switch, when the base voltage of the transistor 461 is "Low", the transistor 461 is brought into a shutdown state, so the operation of the transistor 462, that is, the conduction/shutdown as a switch is determined according to the signal value inputted into the transistor 462.

On the other hand, when "High" is inputted into the base terminal of the transistor 461, the operation of the conducted transistor 461 is dominant, so no current flows through the collector-emitter of the transistor 462 irrespective of the inputted signal. In other words, in this case, the switch is brought into a shutdown state. When the transistor 461 is conducted, a current larger than a current flowing through the transistor 462 flows through the transistor 461 (for example, V1−V2>0.3 (Volt)). Moreover, in a path from the power source (Vcc) to the transistors 461 and 462, it is found out that the resistance on the transistor 461 side is much lower than that on the transistor 462 side. Therefore, even if "High" is inputted into the transistor 462, a current supplied from the power source (Vcc) flows not into the transistor 462 but into the transistor 461. Moreover, in this case, the potential of the connection point (the common emitter voltage of the transistors 461 and 462) is a value equal to V1 from which a forward voltage in the base-emitter of the transistor 461 is subtracted. As a result, the voltage in the base-emitter of the transistor 462 is 0.3 V lower than the forward voltage in the base-emitter of the transistor 462, so it is difficult for a current to flow through the transistor 462.

Thus, the switch is conducted only in the case where "Low" is inputted into the transistor 461, and "High" is inputted into the transistor 462 (refer to FIG. 19). Therefore, in an example of the structure of the switch, when the write operation is commanded, the write selection signal is set to "Low".

In the current drive according to Modification 2, when a power save signal of a "High" level is inputted into the constant current circuit control terminal 91 from the control logic portion 103 (refer to FIG. 1), the transistors Q8 and Q7 are turned on, and the constant current circuit is brought into an active state. In such an active state, the address decoders 108A and 106A (refer to FIG. 1) select one circuit selection signal, one word decode line 16X and one bit decode line 16Y (refer to FIG. 5) corresponding to the address decode value. Moreover, the write selection signal indicating the write mode is transmitted from the control logic portion 103 through the write selection signal line 90. Thereby, the circuit selector switches SW1 and SW2 are turned on according to the selection signal and the write selection signal, and the current drive to which the circuit selector switches SW1 and SW2 belong is selected as a target to be driven.

Thus, in the current drive according to the modification, the circuit selector switches SW1 and SW2 are operated by not only the circuit selection signal (decode signal) but also the logical sum of the circuit selection signal and the write selection signal, so the write circuit system is selected by the circuit selection signal, and only in the case where the write operation is commanded by the write selection signal, the write circuit system can be operated, and only a circuit system corresponding to the selected word array Xn and the selected bit array Yn can be operated. Further, the whole current drive is operated by three control commands by the write selection signal, the circuit selection signal and the power save signal, so the current drive cannot be operated unless otherwise all conditions of the three control signals are satisfied. Therefore, when the necessary conditions are not satisfied, the current drive is in an inactive state so that the power consumption by a leakage current can be largely reduced.

(Modification 3)

Next, a third modification of the current drive will be described below. In the current drive according to Modification 2 shown in FIG. 17, the circuit selector switches SW1 and SW2 are disposed for each current direction control portion 54; however, in the modification, a switch having the functions of the circuit selector switches SW1 and SW2 is disposed for a plurality of the current direction control portions 54.

FIG. 20 shows an example of the structure of such a switch. As in the case of the switch shown in FIG. 18, the structure of the first circuit selector switch SW1 will be described as a basis below; however, the second circuit selector switch SW2 has the same structure as that of the first circuit selector switch SW1. Like device according to the above embodiment, the current drives 108C and 106C are formed as the write current drive circuits according to the invention; however, the write current drive circuit according to the invention is not necessarily applied to all current supply circuits, and the write current drive circuit according to the invention may be applied to at least a part of the current supply circuits. For example, it can be considered that the write current drive circuit according to the invention may be used in either an X direction current supply circuit or a Y direction current supply circuit. As both ends of the write lines 6X and 6Y are connected to the current drives 108C and 106C, the write lines 6X and 6Y are wired in the shape of the letter U; however, a write line connected to the current supply source which has any other structure does not necessarily have the shape of the letter U, and an end thereof may be connected to the current supply source and the other end thereof may be connected to the ground as in the related art.

Figure 21:
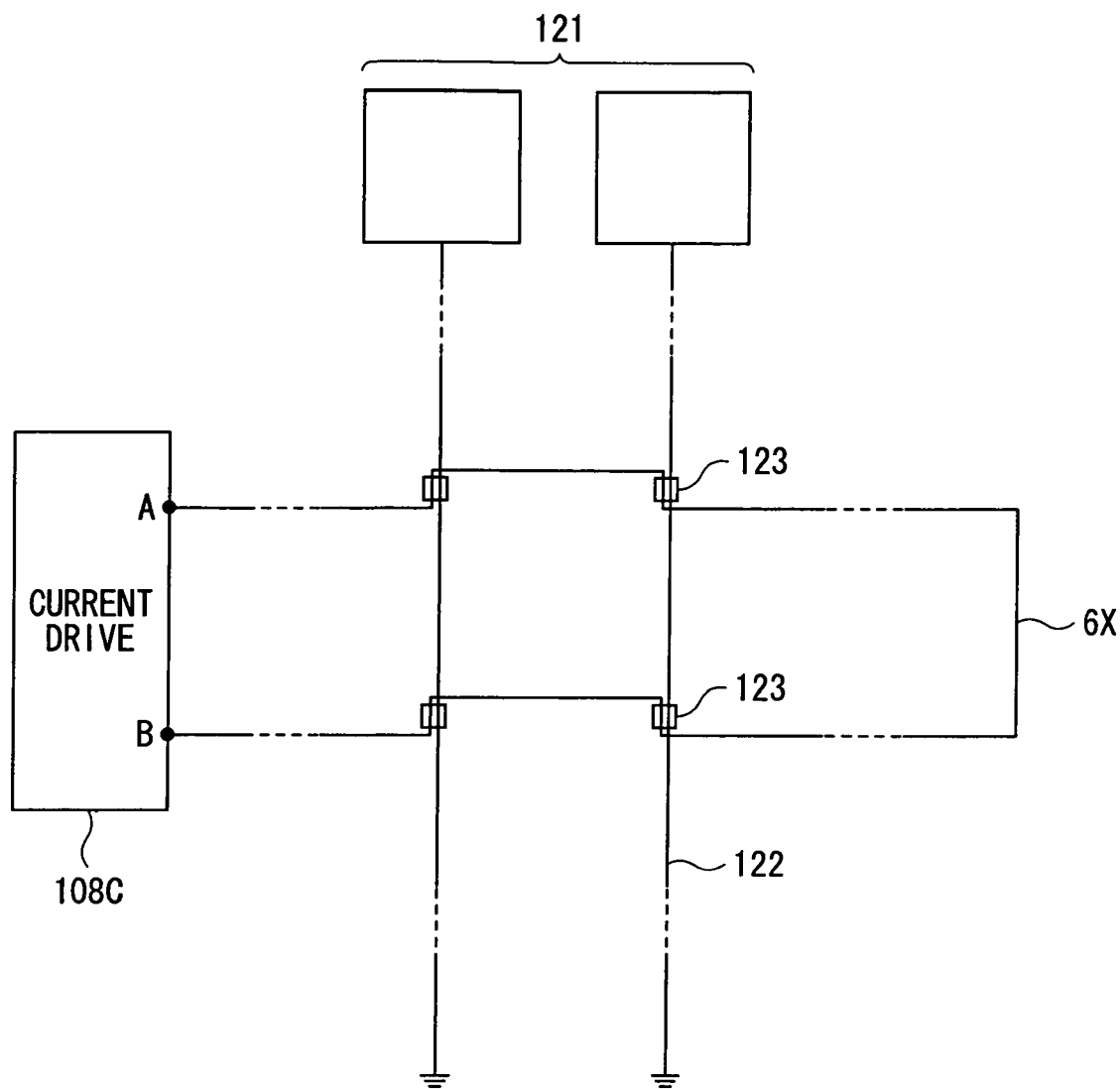
FIG. 21 is a structural view of a modification of the write circuit system shown in FIG. 3.
Figure 22:
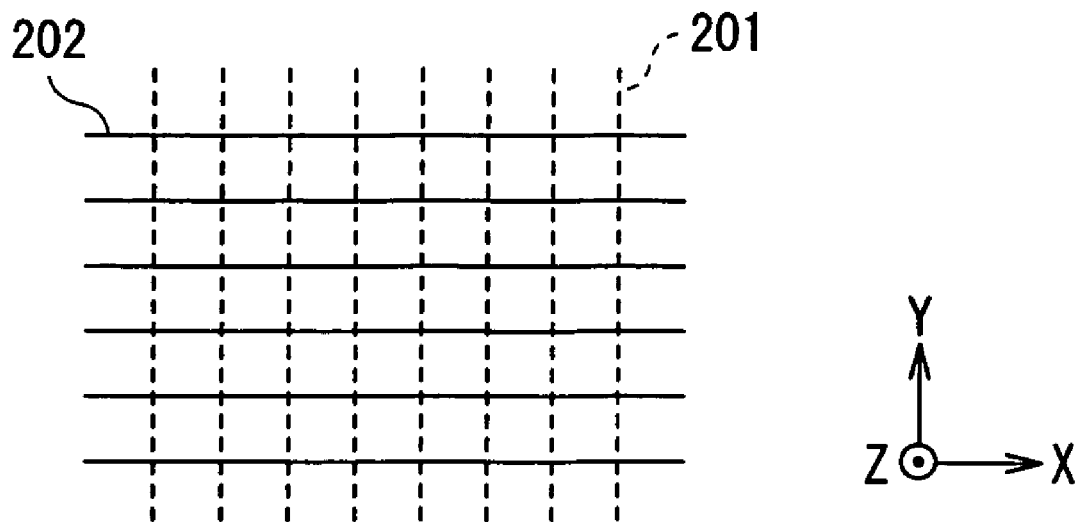
FIG. 22 is a plan view showing a wiring structure of write lines in a write circuit system in a related art.
Figure 23:
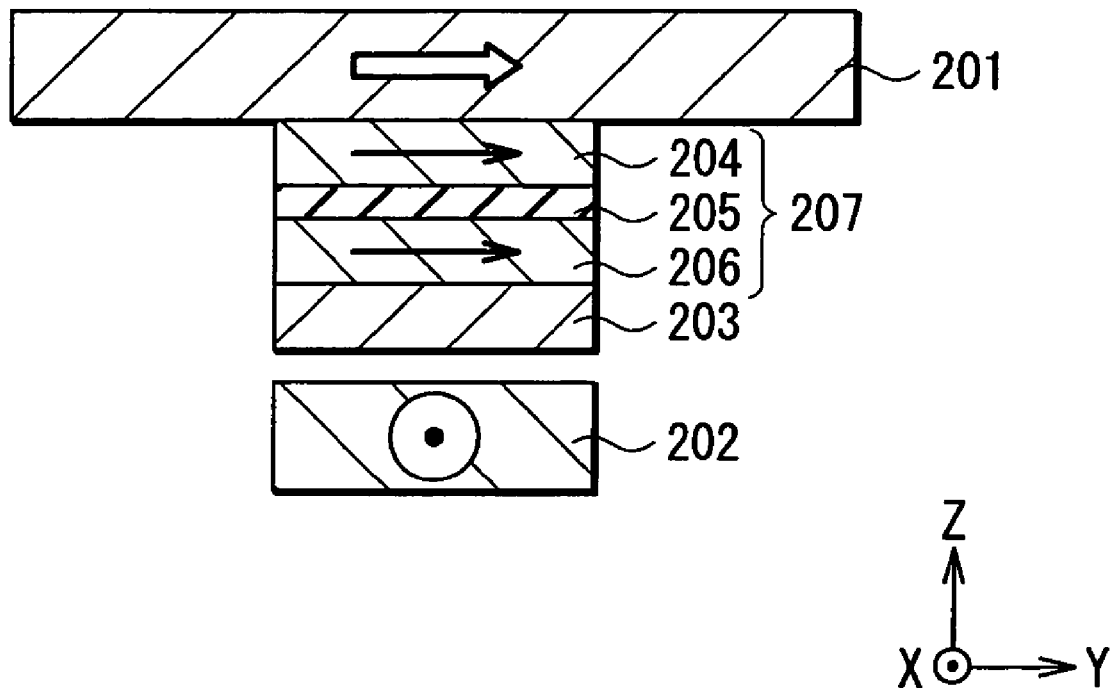
FIG. 23 is a sectional view of a memory cell in the write circuit system in the related art.
Figure 24:
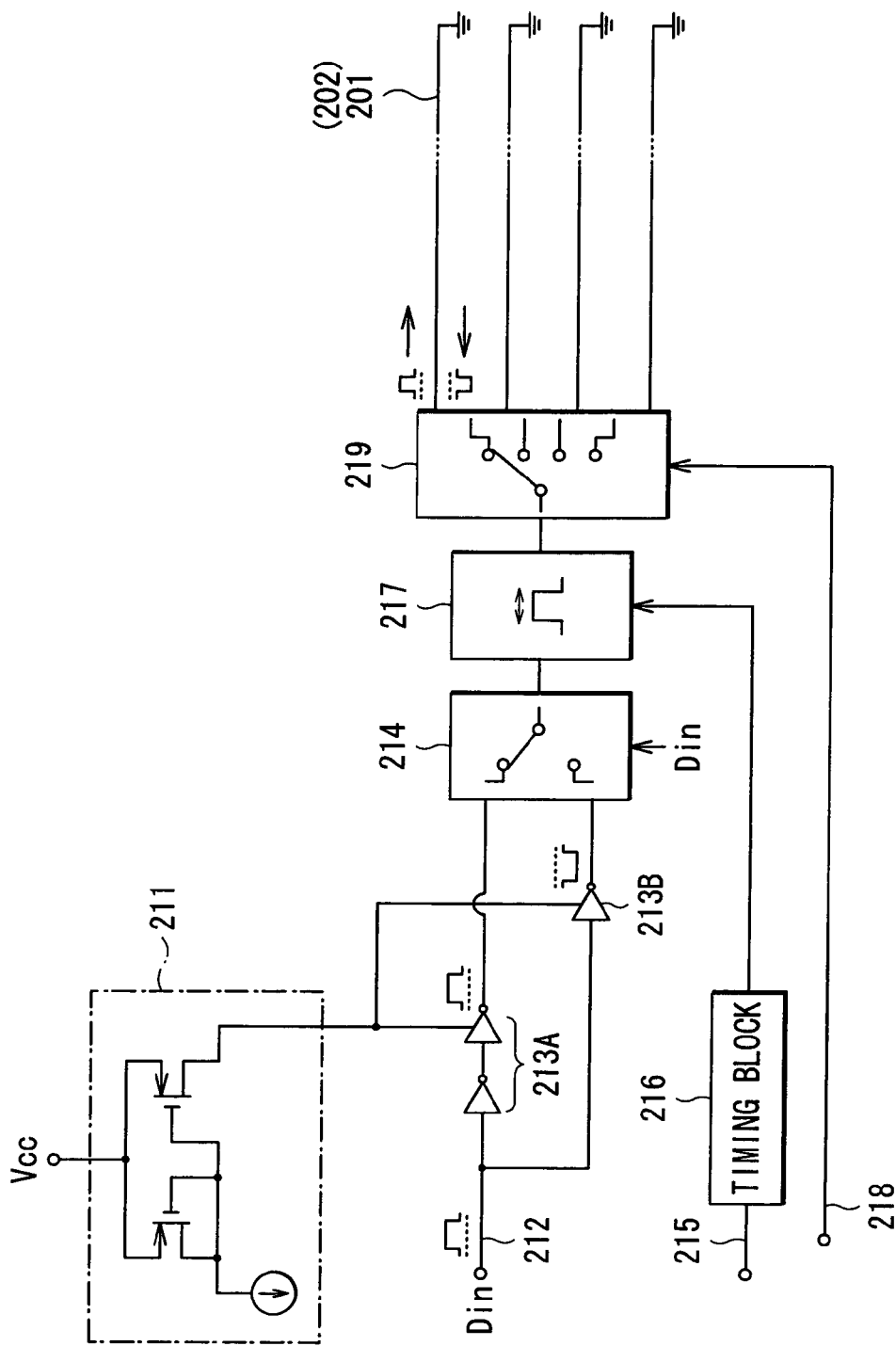
FIG. 24 is a block diagram of a current drive in the write circuit system in the related art.

A specific example of such a structure is shown in FIG. 21. In this case, an X direction write circuit system includes a combination of the current drive 108C and a U-shaped write word line 6X as in the case of the embodiment, and a Y direction circuit system includes a Y direction current drive 121 formed as in a current supply circuit in the related art and a linear write bit line 122 having an end connected to the Y direction current drive 121 and the other end grounded.

The outward route and the homeward route of the write word line 6X is bent in each intersection region of the write line 6X and the write bit line 122, and a magnetoresistive device 123 is disposed in each intersection region. When the magnetoresistive devices are disposed in the outward route and the homeward route of the write word line 6X, the magnetoresistive devices can be packed with a double density. The magnetoresistive devices 123 each can be operated so as to carry one unit of information as one memory cell, and two of the magnetoresistive devices 123 can be operated as one memory cell (for example, as described in the embodiment, two adjacent magnetoresistive devices 123 in an X direction can be operated as one cell).

Thus, in the magnetic memory device according to the invention, any other modification is possible, except that the both ends of the write line 6 are connected to the current drive according to the invention. Moreover, as shown in the specific example, the write line 6 to which a current is supplied from the current drive according to the invention can be modified as long as the both ends of the write line 6 are connected to form a closed loop, and wiring in a memory cell region may have any shape. For example, the write line 6 does not necessarily have the shape of the letter U, and can have any other wiring structure such as the case where the write lines 6 are orthogonal to each other as in the related art in addition to the case where the write lines 6 are parallel to each other in a region where the magnetoresistive device is formed.

In the write current drive circuit according to the invention, as described referring to the modifications, the specific structure of a circuit portion corresponding to the current direction control portion and the current amount control portion is not limited to the embodiment, and may be any other structure as long as the functions of the circuit portion can be embodied. In the above embodiment, the current drives 108C and 106C each include bipolar transistors; however, the current drive according to the invention is not limited to this, and can include any other semiconductor device such as MOSFET or CMOS.

Moreover, a pair of the magnetoresistive devices 12A and 12B constitute the memory cell 12 carrying one unit of information; however, each device may carry one unit of information. Further, the structure of the magnetoresistive device is not necessarily the same as that described in the embodiment, and may not include a toroidal magnetic layer. In the embodiment, the magnetoresistive devices 12A and 12B are the TMR devices; however, the magnetoresistive devices 12A and 12B may be GMR devices instead of the TMR devices. The devices in this case can be the same as the magnetoresistive device 12A (12B), except that the non-magnetic layer 2 is a non-magnetic metal layer instead of the insulating layer. Thus, any known device structure can be applied to the magnetoresistive device according to the invention, and the magnetoresistive device according to the invention may be a CPP (Current Perpendicular to the Plane) type in which a current flows in a direction perpendicular to a laminate surface of the magnetic layer or a CIP (Current flows in the Plane) in which a current flow in a direction parallel to the laminate surface of the magnetic layer.

As described above, in the magnetic memory device, the write current drive circuit or a write current driving method according to the invention, a constant current circuit is shared among a plurality of current direction control circuits, and the direction of a write current in each write line is controlled according to an inputted write data signal by the current direction control circuit, and the write current flowing through each write line becomes constant by the constant current circuit. Therefore, the number of write circuit components can be reduced. Moreover, variations in the write current flowing through each write line and the power consumption for write operation can be reduced.

The invention claimed is:

1. A magnetic memory device, comprising:
   a plurality of magnetoresistive devices including a magnetic sensitive layer of which the magnetization direction changes according to an external magnetic field;
   a plurality of write lines where a write current for generating an external magnetic field which is applied to the magnetic sensitive layer flows;
   a plurality of current direction control circuits each of which is disposed for each write line, and has a function of controlling the direction of a write current in each write line according to an inputted write data signal; and
   a constant current circuit being shared among the plurality of current direction control circuits and making the write current flowing through each write line constant, wherein each write line has a loop shape in which both ends of the write line are connected to the current direction control circuit.

2. A magnetic memory device according to claim 1, wherein
the current direction control circuit includes:
a first differential switch pair including a first current switch and a second current switch which are disposed corresponding to both ends of the write line, and operate to turn to switching states different from each other;
a second differential switch pair including a third current switch and a fourth current switch which are disposed corresponding to the first current switch and the second current switch, respectively, and operate to turn to switching states different from each other; and
a differential control means including a fifth current switch and a sixth current switch which operate to turn to switching states different from each other, and controlling to bring the first current switch and the fourth current switch into the same switching state and bring the second current switch and the third current switch into a switching state different from that of the first current switch and the fourth current switch.

3. A magnetic memory device according to claim 2, wherein
the first through sixth current switches include first through sixth transistors, respectively.

4. A magnetic memory device according to claim 3, further comprising:
a circuit selector switch for each current direction control circuit so as to select one of a plurality of current direction control circuits,
wherein the constant current circuit includes:
a resistor for current control; and
a transistor for current control in which the collector terminal thereof is commonly wired to the emitter terminals of the third transistors and the fourth transistors in the plurality of current direction control circuits through the circuit selector switch, and the emitter terminal thereof is grounded through the resistor for current control, and a constant voltage is selectively inputted into the base terminal thereof, and
the sum of currents flowing through the third transistor and the fourth transistor in a current direction control circuit selected by the circuit selector switch becomes constant by the constant current circuit.

5. A magnetic memory device according to claim 4, wherein
the constant voltage is produced through the use of a band gap reference.

6. A magnetic memory device according to claim 4, wherein
a diode is disposed between the base of the transistor for current control and the ground.

7. A magnetic memory device according to claim 4, wherein
the switching operation of the circuit selector switch is controlled on the basis of a circuit selection signal for selecting one of the plurality of current direction control circuits.

8. A magnetic memory device according to claim 4, wherein
the switching operation of the circuit selector switch is controlled on the basis of a circuit selection signal for selecting one of the plurality of current direction control circuit and a write selection signal indicating a write mode.

9. A magnetic memory device according to claim 3, wherein
the base terminal of the fifth transistor is connected to the collector terminal of the third transistor, and the collector terminal of the fifth transistor is connected to the base terminal of the second transistor, and
the base terminal of the sixth transistor is connected to the collector terminal of the fourth transistor, and the collector terminal of the sixth transistor is connected to the base terminal of the first transistor.

10. A magnetic memory device according to claim 3, further comprising:
a second constant current circuit being shared among the plurality of current direction control circuits, and making the sum of currents flowing through the fifth transistor and the sixth transistor constant.

11. A magnetic memory device according to claim 10, further comprising:
a second circuit selector switch for each current direction control circuit so as to select one of a plurality of current direction control circuits,
wherein the second constant current circuit includes:
a second resistor for current control; and
a second transistor for current control in which the collector terminal thereof is commonly wired to the emitter terminals of the fifth transistors and the sixth transistors in the plurality of current direction control circuits through the second circuit selector switch, and the emitter terminal thereof is grounded through the second resistor for current control, and a constant voltage is selectively inputted into the base terminal thereof.

12. A magnetic memory device according to claim 3, wherein
the collector terminals of the first transistor and the second transistor are connected to a power source,
an end of the write line is connected to the emitter terminal of the first transistor and the collector terminal of the third transistor, and
the other end of the write line is connected to the emitter terminal of the second transistor and the collector terminal of the fourth transistor.

13. A magnetic memory device according to claim 3, wherein
the data signal is inputted into the base terminal of either the third transistor or the fourth transistor, and an inversion signal of the data signal is inputted into the base terminal of the other transistor.

14. A magnetic memory device according to claim 3, wherein
the fifth transistor detects the switching state of the third transistor, and operates the second transistor to turn to the same switching state as that of the third transistor, and
the sixth transistor detects the switching state of the fourth transistor, and operates the first transistor to turn to the same switching state as that of the fourth transistor.

15. A magnetic memory device according to claim 3, wherein
a first bias resistor is disposed between a connection point of the collector terminal of the fifth transistor and the base terminal of the second transistor and a power source, and a second bias resistor is disposed between a connection point of the collector terminal of the sixth transistor and the base terminal of the first transistor and the power source.

16. A magnetic memory device according to claim 1, wherein
the magnetoresistive device includes:
a laminate which includes the magnetic sensitive layer and through which a current flows in a direction perpendicular to a laminate surface; and
a toroidal magnetic layer which is disposed on one surface of the laminate so that its direction along the laminate surface is its axial direction, and the write line passes through the toroidal magnetic layer.

17. A magnetic memory device according to claim 16, wherein
the write line includes a plurality of first write lines and a plurality of second write lines extending so as to intersect with the plurality of first write lines, and
the first write lines and the second write lines extend in parallel to each other in a region where the first write lines and the second write lines pass through the toroidal magnetic layer.

18. A magnetic memory device according to claim 1, wherein
one memory cell includes a pair of the magnetoresistive devices.

19. A magnetic memory device according to claim 18, wherein
the magnetization directions of magnetic sensitive layers in the pair of magnetoresistive devices change according to a magnetic field induced by a current flowing through a first write line and a second write line so as to be antiparallel to each other, thereby information is stored in the memory cell.

20. A write current drive circuit, being applied to a magnetic memory device, the magnetic memory device including a plurality of magnetoresistive devices including a magnetic sensitive layer of which the magnetization direction changes according to an external magnetic field, and a plurality of loop-shaped write lines where a write current for generating an external magnetic field which is applied to the magnetic sensitive layer flows, the write current drive circuit comprising:
a pair of connection ends to which both ends of the write line are connected;
a plurality of current direction control circuits each of which is disposed for each write line, and has a function of controlling the direction of a write current in each write line according to an inputted write data signal; and
a constant current circuit being shared among the plurality of the current direction control circuits, and making the write current flowing through each write line constant.

21. A write current driving method, being applied to a magnetic memory device, the magnetic memory device including a plurality of magnetoresistive devices including a magnetic sensitive layer of which the magnetization direction changes according to an external magnetic field, and a plurality of loop-shaped write lines where a write current for generating an external magnetic field which is applied to the magnetic sensitive layer flows,
wherein a current direction control circuit is disposed for each write line, and both ends of the write line are connected to the current direction control circuit, and a constant current circuit is shared among the plurality of current direction control circuits, and
the current direction control circuit controls the direction of a write current in each write line according to an inputted write data signal, and the constant current circuit makes the write current flowing through each write line constant.

* * * * *